(12) United States Patent
Rakow et al.

(10) Patent No.: US 7,413,607 B2
(45) Date of Patent: Aug. 19, 2008

(54) TEMPLATED SEMICONDUCTOR PARTICLES AND METHODS OF MAKING

(75) Inventors: Neal A. Rakow, Woodbury, MN (US); Michael S. Wendland, North St. Paul, MN (US); Mary I. Buckett, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 278 days.

(21) Appl. No.: 11/095,142

(22) Filed: Mar. 31, 2005

(65) Prior Publication Data

US 2006/0219159 A1  Oct. 5, 2006

(51) Int. Cl.
*G01N 33/551* (2006.01)
*C02F 1/42* (2006.01)
*C30B 7/00* (2006.01)
*B22F 1/00* (2006.01)

(52) U.S. Cl. .................. 117/68; 436/525; 436/524; 210/688; 977/896; 977/897; 75/343; 75/370

(58) Field of Classification Search ............. 117/68; 436/524, 525; 210/688; 977/896, 897; 75/343, 75/370
See application file for complete search history.

(56) References Cited

U.S. PATENT DOCUMENTS

| | | | |
|---|---|---|---|
| 5,780,251 A | | 7/1998 | Klainer et al. |
| 5,938,934 A | * | 8/1999 | Balogh et al. ............... 210/688 |
| 6,288,197 B1 | | 9/2001 | Youngs et al. |
| 6,350,384 B1 | | 2/2002 | Dvornic et al. |
| 6,660,379 B1 | | 12/2003 | Lakowicz et al. |
| 6,664,315 B2 | | 12/2003 | Tomalia et al. |
| 7,153,703 B2 | * | 12/2006 | Peng et al. ............... 436/524 |
| 2001/0011109 A1 | | 8/2001 | Tomalia et al. |
| 2002/0045614 A1 | | 4/2002 | Becker et al. |
| 2004/0101976 A1 | * | 5/2004 | Peng et al. ............... 436/525 |

FOREIGN PATENT DOCUMENTS

| | | |
|---|---|---|
| EP | 0 928 813 | 7/1999 |
| WO | WO 98/30604 | 7/1998 |
| WO | WO 00/46839 | 8/2000 |
| WO | WO 2004/081072 | 9/2004 |

OTHER PUBLICATIONS

Chan et al., Science 281, Issue 5385, pp. 2016-2018 (1998).
Murray et al., J. Am. Chem. Soc. 115, pp. 8706-8715, (1993).
Zimmerman et al., Nature 418, pp. 399-403, (2002).
Wendland et al., J. Am. Chem. Soc. 121, pp. 1389-1390 (1999).
Crooks et al., Accounts of Chemical Research, 34, pp. 181-190 (2001).
Brust et al., J. Chem. Soc., Chem. Commun. pp. 801-802 (1994).

(Continued)

*Primary Examiner*—Robert Kunemund
*Assistant Examiner*—G. Nagesh Rao
(74) *Attorney, Agent, or Firm*—Jean A. Lown

(57) ABSTRACT

Composite particles of a semiconductor particle such as a metal chalcogenide within a crosslinked, cored dendrimer are described. Additionally, methods of making the composite particles and compositions that contain the composite particles are described.

12 Claims, 1 Drawing Sheet

20.00 μm

OTHER PUBLICATIONS

Wang et al., Journal of Polymer Science, 38, pp. 4147-4153 (2000).
Tominaga et al., Chemistry Letters. pp. 374-375 (2000).
Schultze et al., Angew. Chem. Int. Ed. 40, pp. 1962-1966 (2001).
Guo et al., J. Am. Chem. Soc. *Luminescent CdSe/Cds Core/Shell Nanocrystals in Dendron* (2002).
Gopidas et al., J. Am. Chem. Soc. 125, pp. 6491-6502, (2003).
Shon et al, "Nanoparticle-cored Dendrimers Synthesized from Functionalized Gold Nanoparticles", Polymeric Materials: Sci & Eng 2004, 91, 1068.
Hanus, "Aggregation Kinetics of Dendrimer-Stabilized CdS Nanoclusters", Langmuir 2000, 16, 2621-2626.

* cited by examiner

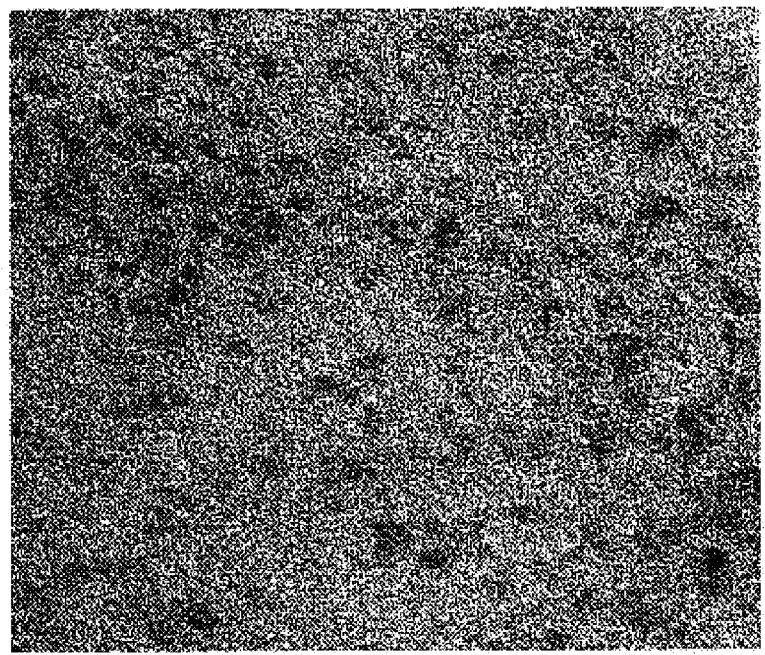
*Fig. 1*  20.00 µm
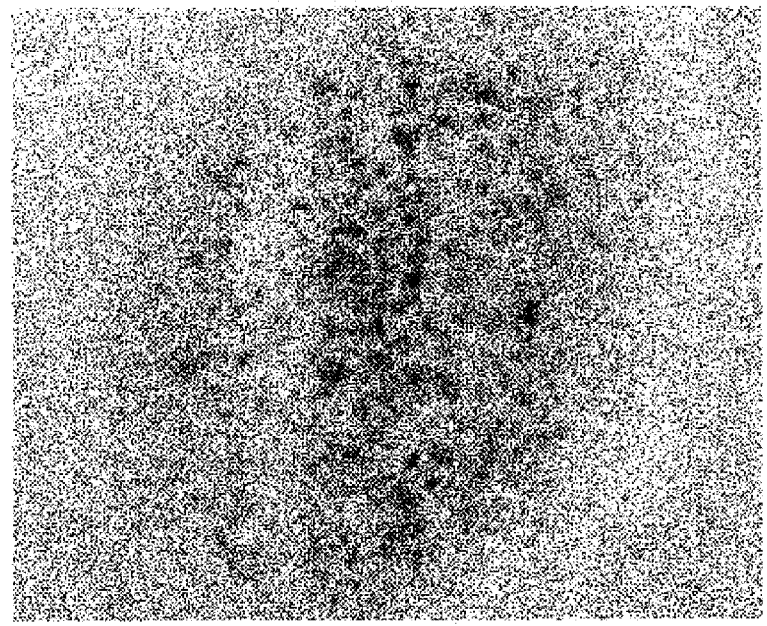
*Fig. 2*  20.00 µm

TEMPLATED SEMICONDUCTOR PARTICLES AND METHODS OF MAKING

BACKGROUND

Semiconductor particles in the nanometer size range (e.g., 1 to 100 nanometers or 1 to 10 nanometers) are of increasing interest in a variety of applications such as catalysis, electronic devices, and sensors. Many methods that are used to prepare semiconductor particles in this size range, however, are problematic.

Semiconductor particles such as cadmium sulfide and zinc sulfide in the nanometer size range have been prepared by reacting organometallic reagents with sulfur sources at temperatures in the range of 250° C. to 300° C. At least some of these organometallic reagents are toxic.

Semiconductor particles in the nanometer size range have been prepared within dendritic structures. The dendritic structures have been loaded with cations from a soluble metal salt and then precipitated. These metals are typically coordinated on the outer surface by functional groups within the dendritic structure. Such coordination can disadvantageously affect the utility of the semiconductor particles for various applications such as where it is desirable to modify the particle surface after it has been prepared.

SUMMARY OF INVENTION

Semiconductor particles and a method of making semiconductor particles in the nanometer size range are disclosed. More specifically, the semiconductor particles are formed within a crosslinked dendritic structure that has the core organic material (e.g., the zero generation material) or the core organic material plus other lower generation material removed.

In a first aspect, a method of making semiconductor particles is disclosed. The method involves providing a dendrimer that contains a core organic material, a first dendron bonded to the core organic material through a first attachment group that can be chemically cleaved, and a second dendron bonded to the core organic material through a second attachment group that can be chemically cleaved. The first dendron has at least two first crosslinkable groups and the second dendron has at least two second crosslinkable groups. The method further involves forming a crosslinked dendrimer by reacting the first crosslinkable groups and the second crosslinkable groups; cleaving by a chemical reaction both the first attachment group and the second attachment group; removing the core organic material or a derivative thereof from the crosslinked dendrimer to form a cored dendrimer having interior end groups; forming a coordinative bond or an ionic bond between a metal-containing precursor and at least one interior end group within a central region of the cored dendrimer; and precipitating the metal-containing precursor to form a semiconductor particle within the central region of the cored dendrimer.

In a second aspect, a composite particle is provided that includes a semiconductor particle within a central interior region of a cored dendrimer. The cored dendrimer has crosslinked dendrons surrounding the central interior region and the central interior region is free of organic material. The semiconductor particle has a size that is greater than the central interior region of the cored dendrimer and that is no greater than an outer dimension of the cored dendrimer.

In a third aspect, a composition is provided that includes an organic matrix and a composite particle in the organic matrix. The composite particle includes a semiconductor particle within a central interior region of a cored dendrimer. The cored dendrimer has crosslinked dendrons surrounding the central interior region and the central interior region is free of organic material. The semiconductor particle has a size that is greater than the central interior region of the cored dendrimer and that is no greater than an outer dimension of the cored dendrimer.

As used herein, the term "dendron" refers to a molecular structure having a plurality of molecular branching groups that divide a single molecular chain into two or more molecular chains. Additional branching groups can further divide a previously divided molecular chain. The molecular chains can be aromatic, aliphatic, heterocyclic, or a combination thereof.

As used herein, the term "dendrimer" or "dendritic structure" refers to a molecular structure that includes at least two dendrons attached to a central molecular species (i.e., the core organic material).

As used herein, the term "crosslinked dendrimer" refers to a dendrimer in which at least two molecular chains of one dendron are crosslinked to molecular chains of one or more other dendrons. Optionally, a molecular chain within one dendron can be crosslinked to another molecular chain within the same dendron. The crosslinks can be along the length of a molecular chain or can be at the outer periphery of a molecular chain of a dendron.

As used herein, the term "cored dendrimer" refers to a crosslinked dendrimer that has been chemically reacted to remove an interior region. That is, the core organic material (i.e., central molecular species) or derivative thereof has been removed from the crosslinked dendrimer to form the cored dendrimer. The cored dendrimer can resemble a crosslinked polymeric sphere that is partially hollow (i.e., the central region of the cored dendrimer is hollow and free of organic material).

As used herein, the term "coordinating" or "coordination" refers to forming a covalent bond between two species where one of the species contributes both electrons. Such a bond is sometimes referred to as a dative bond, as a "coordinative covalent bond", as a "coordinative bond", or as "coordinated".

As used herein, the term "acyl" refers to a monovalent group of formula —(CO)$R^a$ where $R^a$ is an alkyl, aryl, or heterocycle group and where (CO) used herein indicates that the carbon is attached to the oxygen with a double bond.

As used herein, the term "acyloxy" refers to a monovalent group of formula —O(CO)$R^a$ where $R^a$ is an alkyl, aryl, or heterocycle group.

As used herein, the term "acyloxycarbonyl" refers to a monovalent group of formula —(CO)O(CO)$R^a$ where $R^a$ is an alkyl, aryl, or heterocycle group.

As used herein, the term "alkyl" refers to a monovalent group formed from an alkane and includes groups that are linear, branched, cyclic, or combinations thereof. The alkyl group typically has 1 to 30 carbon atoms. In some embodiments, the alkyl group contains 1 to 20 carbon atoms, 1 to 10 carbon atoms, 1 to 6 carbon atoms, or 1 to 4 carbon atoms. Examples of alkyl groups include, but are not limited to, methyl, ethyl, n-propyl, isopropyl, n-butyl, isobutyl, tert-butyl, n-pentyl, n-hexyl, cyclohexyl, n-heptyl, n-octyl, and ethylhexyl. The alkyl group can be unsubstituted or substituted with one or more substituents selected from, for example, hydroxy, alkoxy, amino, aryl, or halo groups.

As used herein, the term "alkoxy" refers to a monovalent group of formula —O$R^b$ where $R^b$ is an alkyl.

As used herein, the term "amino" refers to monovalent group of formula —NHR$^c$ where R$^c$ is hydrogen, alkyl, aryl, or heterocycle.

As used herein, the term "aryl" refers to a monovalent aromatic carbocyclic radical. The aryl can have one aromatic ring or can include up to 5 carbocyclic ring structures that are connected to or fused to the aromatic ring. The other ring structures can be aromatic, non-aromatic, or combinations thereof. Examples of aryl groups include, but are not limited to, phenyl, biphenyl, terphenyl, anthryl, naphthyl, acenaphthyl, anthraquinonyl, phenanthryl, anthracenyl, pyrenyl, perylenyl, and fluorenyl. An aryl group can be unsubstituted or substituted, for example, with one or more substituents selected, for example, from alkyl, alkoxy, halo, hydroxy, amino, or combinations thereof.

As used herein, the term "borono" refers to a group of formula —B(OH)$_2$.

As used herein, the term "carbonyl" refers to a divalent group of formula —(CO)— where there is a double bond between the carbon and oxygen.

As used herein, the term "carboxy" refers to a monovalent group of formula —(CO)OH.

As used herein, the term "chlorophosphono" refers to a monovalent group of formula —OP(O)(OR$^c$)Cl where R$^c$ is hydrogen, alkyl, aryl, or heterocycle.

As used herein, the term "chlorophosphito" refers to a monovalent group of formula —OP(OR$^c$)Cl where R$^c$ is hydrogen, alkyl, aryl, or heterocycle.

As used herein, the term "chlorosulfonyl" refers to a monovalent group of formula —SO$_2$Cl.

As used herein, the term "chlorosilyl" refers to a monovalent group of formula —SiR$^d_2$Cl where each R$^d$ is independently an alkyl, aryl, or alkoxy.

As used herein, the term "formyl" refers to a monovalent group of formula —(CO)H.

As used herein, the term "halo" refers to a monovalent group of formula —F, —Cl, —Br, or —I.

As used herein, the term "halocarbonyl" refers to a monovalent group of formula —(CO)X where X is a halo. A chlorocarbonyl is one example of a halocarbonyl group.

As used herein, the term "heterocyclic" or "heterocycle" refers to a cyclic group or cyclic compound that is aromatic or non-aromatic and that contains at least one heteroatom selected from O, N, S, P, or Si. The heterocyclic group or compound can include one ring or can contain up to 5 rings, up to 4 rings, up to 3 rings, or 2 rings that are fused or connected where at least one ring contains a heteroatom. Exemplary heterocyclic groups or compounds contain up to 20 carbon atoms, up to 15 carbon atoms, up to 10 carbon atoms, or up to 5 carbon atoms and up to 5 heteroatoms, up to 4 heteroatoms, up to 3 heteroatoms, or up to 2 heteroatoms. Some heterocycle groups are five-membered rings or six-membered rings with 1, 2, or 3 heteroatoms.

As used herein, the term "hydroxy" refers to a monovalent group of formula —OH.

As used herein, the term "isocyanto" refers to a monovalent group of formula —NCO.

As used herein, the term "mercapto" refers to a monovalent group of formula —SH.

As used herein, the term "phosphono" refers to a monovalent group of formula —P(O)(OH)(OR$^c$) where R$^c$ is hydrogen, alkyl, aryl, or heterocylic.

As used herein, the term "phosphate" refers to a monovalent group of formula —OP(O)(OH)(OR$^c$) where R$^c$ is hydrogen, alkyl, aryl, or heterocycle.

As used herein, the term "phosphonamino" refers to a monovalent group of formula —NHP(O)(OH)(OR$^c$) where R$^c$ is hydrogen, alkyl, aryl, or heterocycle.

As used herein, the term "silanol" refers to a monovalent group of formula —SiR$^d_2$(OH) where each R$^d$ is independently alkyl, aryl, or alkoxy.

As used herein, the term "sulfamino" refers to a monovalent group of formula —NHS(O)$_2$(OH).

As used herein the term "sulfono" refers to monovalent group of formula —S(O)$_2$(OH).

The above summary of the present invention is not intended to describe each disclosed embodiment or every implementation of the present invention. The Figures, Detailed Description, and Examples that follow more particularly exemplify these embodiments.

BRIEF DESCRIPTION OF THE DRAWINGS

The invention may be more completely understood in consideration of the following detailed description of various embodiments of the invention in connection with the accompanying drawings, in which:

FIG. 1 is a transmission electron micrograph of composite particles that contain zinc sulfide particles within cored dendrimers; and FIG. 2 is a transmission electron micrograph of a composition that includes composite particles in a polystyrene matrix. The composite particles contain cadmium sulfide particles within cored dendrimers.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Composite particles that include semiconductor particles within central regions of cored dendrimers are described. The cored dendrimers can function as templates for the formation of semiconductor particles and often define the maximum size of the semiconductor particles. The semiconductor particles include, for example, a metal chalcogenide (e.g., metal sulfide, metal selenide, metal telluride, or a combination thereof).

In one aspect, a method of making semiconductor particles is disclosed. A dendrimer is provided that includes a core organic material, a first dendron bonded to the core organic material through a first attachment group that can be chemically cleaved, and a second dendron bonded to the core organic material through a second attachment group that can be chemically cleaved. Each dendron has at least two crosslinkable groups (the first dendron has at least two first crosslinkable groups and the second dendron has at least two second crosslinkable groups). The first crosslinkable groups and the second crosslinkable groups are reacted to form a crosslinked dendrimer. After formation of the crosslinked dendrimer, the first attachment group and the second attachment group are cleaved by a chemical reaction. The core organic material or a derivative of the core organic material is removed from the crosslinked dendrimer to form a cored dendrimer having interior end groups. A coordinative bond or ionic bond is formed by reacting a metal-containing precursor with at least one of the interior end groups within a central region of the cored dendrimer. The metal-containing precursor is then precipitated to form a semiconductor particle within the central interior region of the cored dendrimer.

One embodiment of the method is shown schematically in Reaction Scheme A. In this reaction scheme, three dendrons are bonded to the central core organic material through attachment groups. The bonding of the dendrons to the core organic material results in the formation of a dendrimer (i.e., Structure I). The attachment groups (shown by complementary structures as a triangle, square, and circle in Structure I) can be the same or different (e.g., as shown, the attachment groups are different). The X groups on each dendron represent groups that are crosslinkable (e.g., as shown, each dendron has two crosslinkable groups). The E groups represent the peripheral groups (i.e., the end groups furthest from the core organic material) at the outer periphery of the branched molecular chains in the dendrons. Structure II schematically represents the crosslinked dendrimer (i.e., the C—C bond is used to represent the crosslinks formed between two dendrons). Structure III schematically represents the cored dendrimer (i.e., the cored dendrimer has the core organic material removed from a crosslinked dendrimer and has internal end groups that can be bonded to a metal-containing precursor). The internal end groups within the cored dendrimer can be the same or different than the groups on the dendrons originally reacted with the core organic material. As shown, the circle, triangle, and square in Structure III represent the end groups within the interior of the cored dendrimer. Structure IV schematically represents a semiconductor particle within the interior of the cored dendrimer. The size of the semiconductor particle is no greater than an outer dimension of the cored dendrimer but is greater than the central region of the dendrimer that is free of organic material. The outer surface of the semiconductor particle is not bonded to the cored dendrimer (i.e., the outer surface of the semiconductor particle is free of coordinative bonds or ionic bonds to the cored dendrimer).

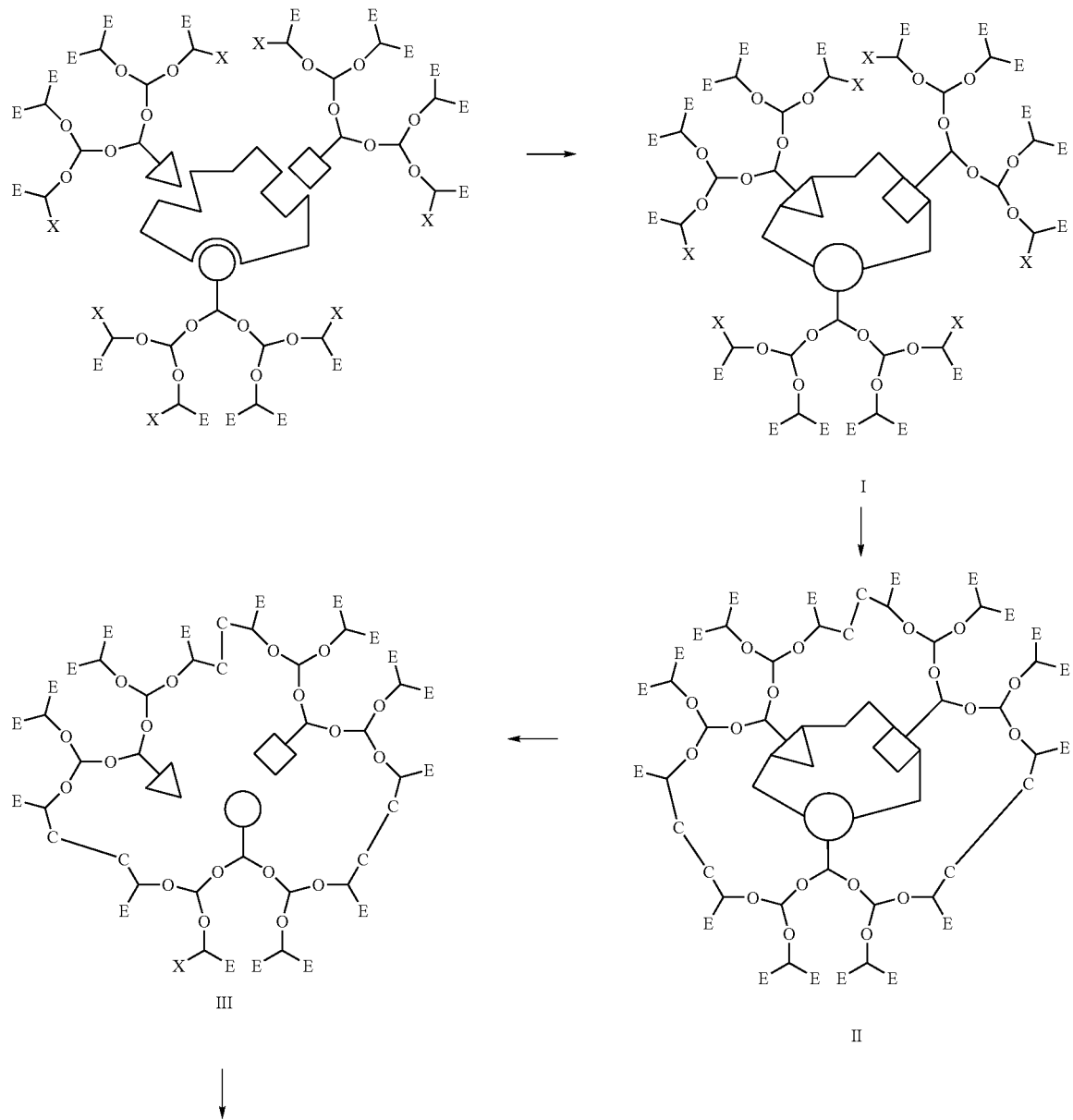

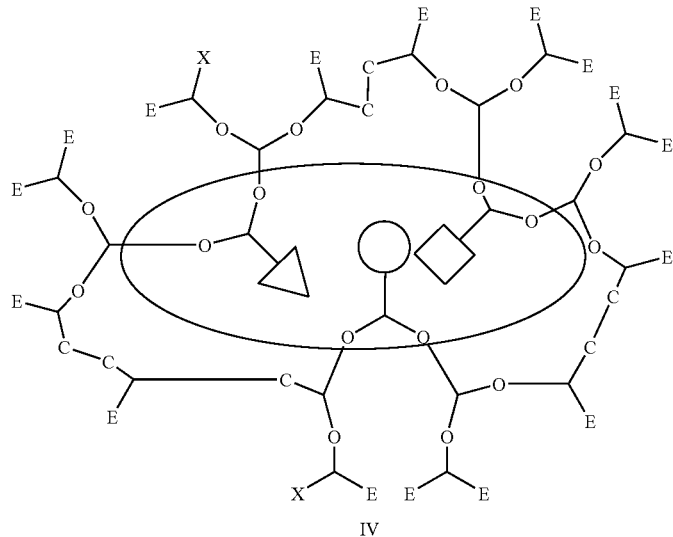

IV

The core organic material (i.e., the central organic material of a dendrimer) can be aliphatic, aromatic, heterocyclic, or a combination thereof and has at least two reactive groups that can form a covalent bond by reacting with a functional group on a dendron. Suitable core organic materials often contain up to 100 carbon atoms, up to 90 carbon atoms, up to 80 carbon atoms, up to 70 carbon atoms, up to 60 carbon atoms, up to 50 carbon atoms, up to 40 carbon atoms, up to 30 carbon atoms, up to 20 carbon atoms, or up to 10 carbon atoms. Some core organic materials contain at least three, at least four, at least five, at least six, at least seven, or at least eight reactive groups. Each reactive group of the core organic material can be a bonding site for a dendron. Exemplary reactive groups include, but are not limited to, hydroxy, halo, carboxy, halocarbonyl, amino, mercapto, sulfono, sulfamino, phosphono, phosphonamino, acyl, borono, silanol, chlorosilyl, trifluoromethylsulfonatesilyl, chlorosulfonyl, chlorophosphono, chlorophosphito, and isocyanto.

In some embodiments, the core organic material includes an aromatic compound having at least three reactive groups. The aromatic compound can be carbocyclic or heterocyclic and can have multiple rings. Exemplary carbocyclic aromatic compounds include substituted benzene compounds such as 1,3,5-tris-hydroxy-benzene; 1,3,5-tris-hydroxymethyl-benzene; 1,3,5-tris-bromomethyl-benzene; 1,3,5-benzenetricarboxylic acid chloride; and the like. Exemplary carbocyclic aromatic compounds having multiple rings include, but are not limited to, 1,4-bis[3,5-dihydroxybenzoyloxy]benzene; 1,1,1-tris(4-hydroxyphenyl)ethane; 1,1,1-tris{4-[4,4-bis(4-hydroxyphenyl)pentoxy]phenyl}ethane; and cyclophanes. Exemplary heterocyclic aromatic compounds include, but are not limited to, substituted porphine compounds such as 5,10,15,20-tetrakis(4-hydroxyphenyl)-21H,23H-porphine, 5,10,15,20-tetrakis(2,6-dihydroxylphenyl)-21H,23H-porphine, and 5,10,15,20-tetrakis(3,5-dihydroxylphenyl)-21H,23H-porphine.

In other embodiments, the core organic material includes an aliphatic compound having at least three reactive groups. Exemplary aliphatic compounds include substituted alkanes such as 2-ethyl-2-hydroxymethyl-propane-1,3-diol; 2,2-bis-hydroxymethyl-propane-1,3-diol (i.e., pentaerythritol); 1,3-dibromo-2,2-bis-bromomethyl-propane; 3-[3-(2-chlorocarbonyl-ethoxy)-2,2-bis-(2-chlorocarbonyl-ethyoxymethyl)-propoxy]-propionyl chloride; pentaerythritol ethoxylate (i.e., $C[CH_2(OCH_2CH_2)_nOH]_4$ where n is an integer of 1 to 10); pentaerythritol propoxylate (i.e., $C[CH_2[OCH_2CH(CH_3)]_nOH]_4$ where n is an integer of 1 to 10); and the like.

The dendrimer can be formed using a divergent or convergent methodology. In a divergent methodology, the dendritic structure is typically constructed through sequential addition of monomers beginning with the core organic material and radiating outward. The core organic material can be referred to as the zero generation. Adding enough monomer to react with all of the reactive sites on the core organic material results in the formation of the first generation dendritic structure. A monomer with at least two additional reaction sites can function as a branching group that splits a single molecular chain into two or three molecular chains. Repetitive addition of more monomer results in the formation of second, third, fourth, fifth, and higher generation dendritic structures. In a convergent methodology, the dendrons are synthesized and then covalently bonded to the core organic material.

The dendrons can be aromatic, aliphatic, or combinations thereof and can have a plurality of branching groups. The dendrons can include heteroatoms. Some exemplary dendrons are poly(ethers), poly(esters), poly(thioethers), poly (arylalkylene ethers), poly(amidoamines), poly(alkylene imine), and the like. The reference by G. R. Newkome et al., *Dendrimers and Dendrons: Concepts, Synthesis Applications*, Wiley-V C H, New York, pp. 1-623 (2001) describes these and other suitable dendrons.

In some embodiments, the dendrons are poly(ethers) such as, for example, poly(benzyl ethers). For example, the dendrons can have a structure such as

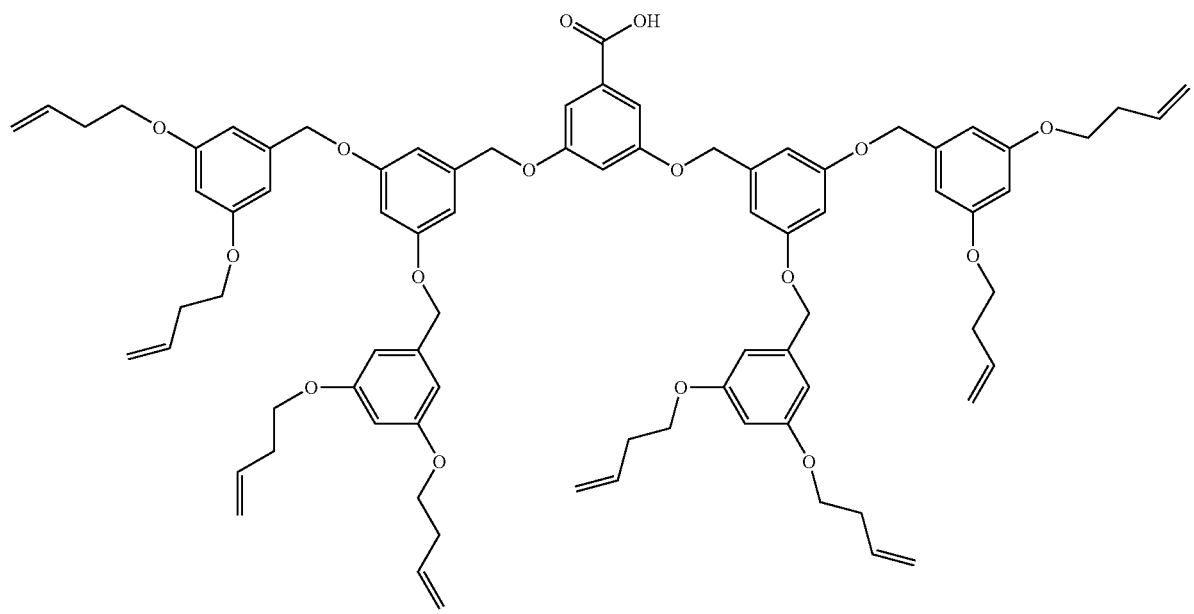

or higher generation analogues thereof. In this exemplary third generation dendron, the crosslinkable groups are alkenyl groups and the local functional group that can react with the core organic material is a carboxy group. The benzene ring with the carboxy group is the first generation region of the dendron. This dendron and other suitable exemplary dendrons are described further in S. C. Zimmerman et al., *Nature*, vol. 418, 399-403 (2002) and Wendland et al., *J. Am. Chem. Soc.*, 121, 1389-1390 (1999).

Each dendron has a focal functional group that can be combined with a reactive group of the core organic material to form an attachment group linking the dendron to the core organic material. The bonding of two or more dendrons to the core organic material results in the formation of a dendrimer. The attachment group is typically a group that contains a chemical bond that can be cleaved (i.e., reacted) to provide an end group within the interior of the cored dendron that is capable of bonding with a metal-containing precursor (e.g., capable of forming a coordinative bond or an ionic bond with a metal-containing precursor). Suitable attachment groups are those that can be attached to the core organic material such that the resulting chemical bond can be cleaved to form an end group such as, for example, a carboxy, hydroxy, amino, mercapto, sulfono, sulfamino, phosphono, phosphonamino, phosphate, borono, silanol, formyl, or acyl within the interior of the cored dendrimer.

The attachment group links the dendrons to the core organic material. Each linkage can be represented by the formula Den-A-Core where Den represents the dendron, A represents the attachment group, and Core represents the core organic material. Each core has at least two such linkages (i.e., each dendrimer has at least two dendrons attached to the core organic material). For ease of discussion, however, the formula shows only one of the two or more linkages to the core organic material.

The linkage denoted by Den-A-Core can be, for example, an anhydride of formula

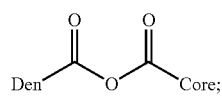

a mixed anhydride formed from a carboxylic acid and sulfonic acid of formula

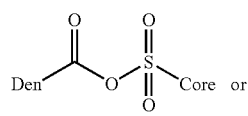 (1)

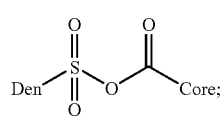 (2)

a carboxylate ester of formula

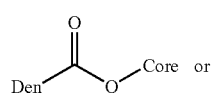 (1)

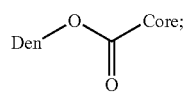 (2)

a thioester of formula
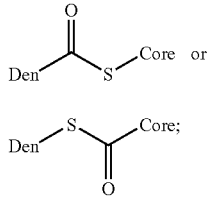
a dithioester of formula
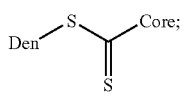
a succinimide ester of formula
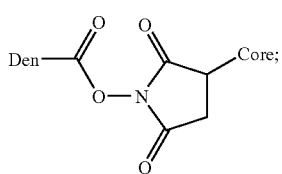
an amide of formula
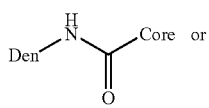
a thioamide of formula
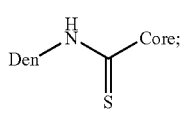
a carbonate of formula
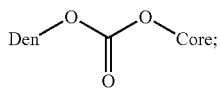
a dithiocarbonate-O-ester of formula
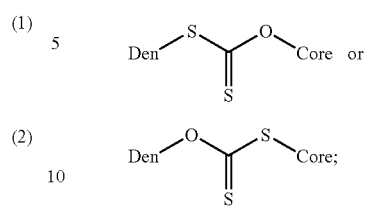
a carbamate of formula
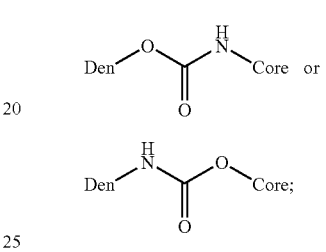
a thiocarbamate-O-ester of formula
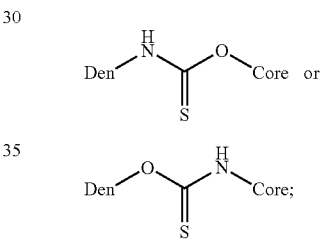
a thiocarbamate-S-ester of formula
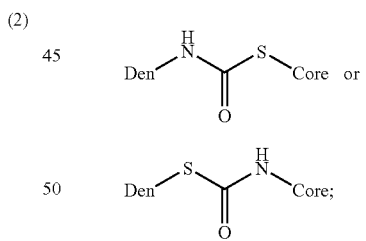
a dithiocarbamate of formula
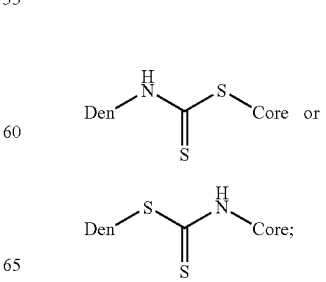

a sulfonate of formula

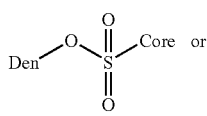

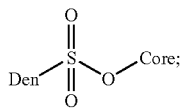

a sulfamide of formula

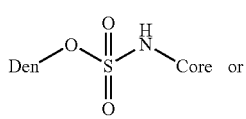

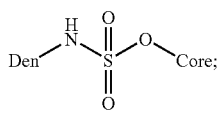

a sulfonamide of formula

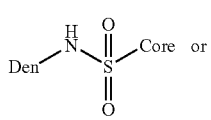

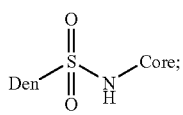

a phosphonate of formula

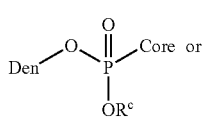

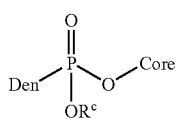

where $R^c$ is hydrogen, alkyl, aryl, or heterocycle;
a thiophosphonate of formula

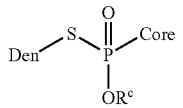

where $R^c$ is hydrogen, alkyl, aryl, or heterocycle;
a phosphoramidate of formula

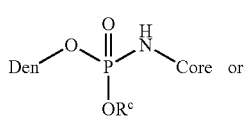

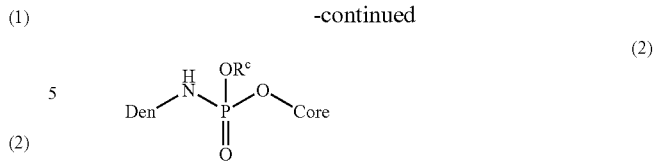

where $R^c$ is hydrogen, alkyl, aryl, or heterocycle;
a thiophosphonamide of formula

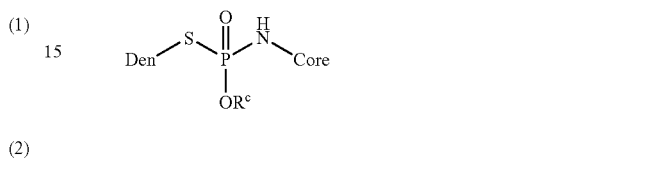

where $R^c$ is hydrogen, alkyl, aryl, or heterocycle;
a phosphoramidite of formula

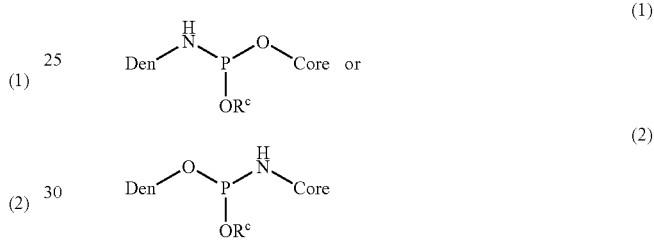

where $R^c$ is hydrogen, alkyl, aryl, or heterocycle;
a phosphate of formula

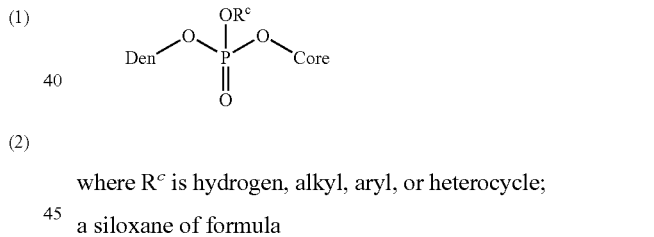

where $R^c$ is hydrogen, alkyl, aryl, or heterocycle;
a siloxane of formula

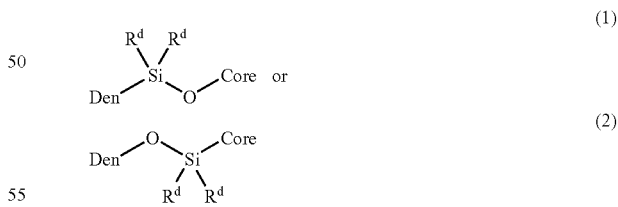

where each $R^d$ is independently an alkyl, alkoxy, or aryl;
a silazane of formula

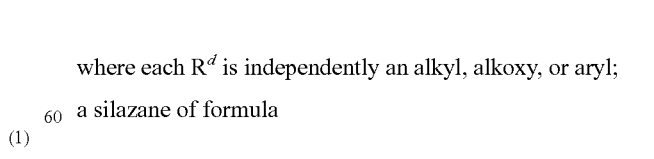

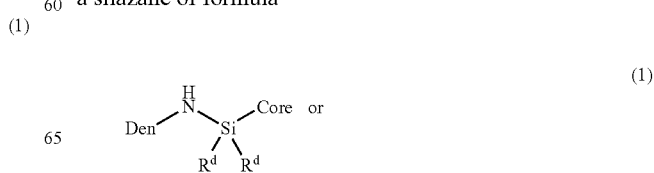

-continued

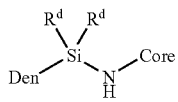 (2)

where each $R^d$ is independently an alkyl, alkoxy, or aryl;
a peroxide of formula

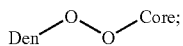

a disulfide of formula

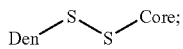

a boronic ester of formula

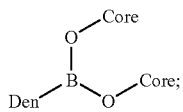

an acetal of formula

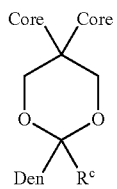

where $R^c$ is hydrogen, alkyl, aryl, or heterocycle;
a di-substituted alkene of formula

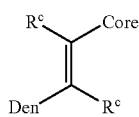

where $R^c$ is hydrogen, alkyl, aryl, or heterocycle;
an imine of formula

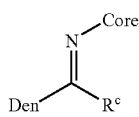

where $R^c$ is hydrogen, alkyl, aryl, or heterocycle;
a photolytically labile ester such as, for example,

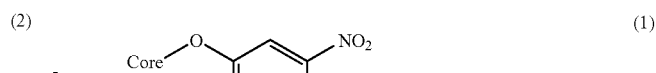 (1)

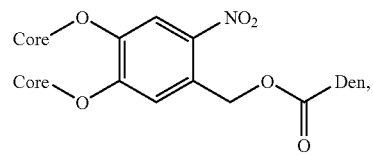 (2)

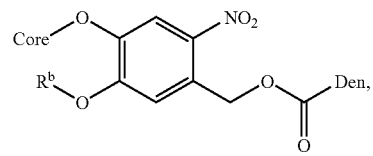 (3)

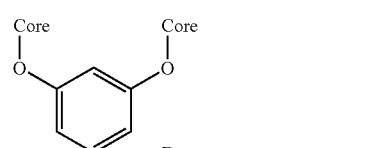 (4)

where $R^b$ is an alkyl;
or photolytically labile carbamates such as, for example,

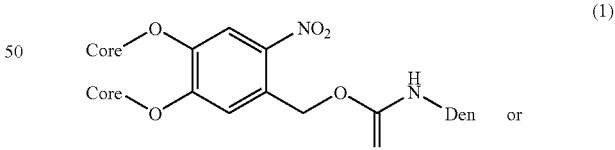 (1)

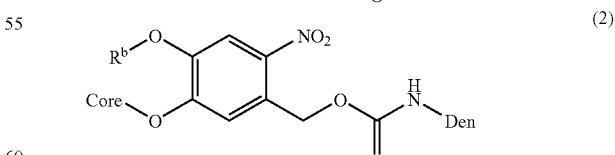 (2)

where $R^b$ is an alkyl.

As used herein, multiple structures for a type of Den-A-Core are designated with a number such as a (1) or (2). For example, using the designation numbers in the list above, carboxylate ester (1) refers to the structure

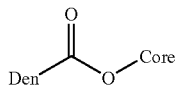

and carboxylate ester (2) refers to the structure

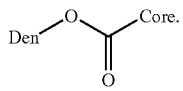

As used herein, the recitation of two or more cores in a formula for the linkage Den-A-Core means that the dendron is covalently attached to the core at multiple locations. For example, a boronic ester, an acetal, some photolytically labile esters, and some photolytically labile carbamates are bonded to the core organic material in at least two locations.

The Den-A-Core linkages can be prepared by any known method. Some of these linkages can be formed by reaction of an electrophilic group (e.g., an activated ester) with a nucleophilic group such as a hydroxy group of an alcohol, an amino group of an amine, or a mercapto group of a mercaptan. The nucleophilic group can be either on the core organic material or on the dendron.

In some embodiments, Den-A-Core is a carboxylate ester. Various chemical approaches can be used to prepare such a linkage. For example, a dendron having a carboxy group (i.e., the dendron is a carboxylic acid) can be reacted with a hydroxy group on the core organic material (i.e., the core organic material is an alcohol) to form carboxylate ester (1).

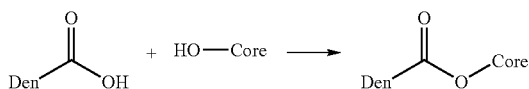

This reaction can occur in the presence of one or more reagents such as, for example, DCC and either DMAP or pyridine; DCC and DPTS; EDC and either DMAP or pyridine; DCC and HBT; DCC and PPY; or PPh$_3$ and either DEAD or DIAD. As used herein, the term "DCC" refers to N,N'-dicyclohexylcarbodiimide. As used herein, the term "DMAP" refers to 4-(dimethylamino)pyridine. As used herein, the term "DPTS" refers to a 1:1 combination of DMAP and p-toluene sulfonic acid. As used herein, the term "EDC" refers to N-(3-dimethylaminopropyl)-N'-ethylcarbodiimide hydrochloride. As used herein, the term "HBT" refers to 1-hydroxy-1H-benzotriazole. As used herein, the term "PPY" refers to 4-(pyrrolidin-1-yl)pyridine. As used herein, the term "PPh$_3$" refers to triphenylphosphine. As used herein, the term "DEAD" refers to diethyl azodicarboxylate. As used herein, the term "DIAD" refers to diisopropyl azodicarboxylate.

Alternatively, a carboxylate ester (1) linkage can be formed by reacting the carboxy group on a dendron with thionyl chloride (SOCl$_2$) or oxalyl chloride (COCl)$_2$ in the presence of a base catalyst to form a dendron having a chlorocarbonyl group. The chlorocarbonyl group then can be reacted with a hydroxy group on the core organic material (i.e., the core organic material is an alcohol) in the presence of a reagent such as pyridine or DMAP.

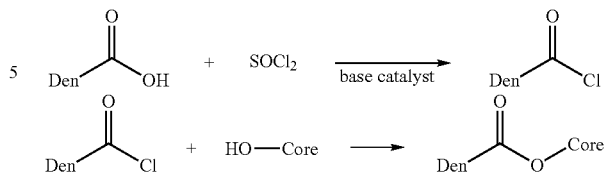

In other embodiments, Den-A-core is carboxylate ester (2). As with carboxylate ester (1), various chemical approaches can be used to prepare such a linkage. For example, a core organic material having a carboxy group (i.e., the core organic material is a carboxylic acid) can be reacted with a dendron having a hydroxy group (i.e., the dendron is an alcohol).

This reaction can be conducted in the presence of the same reagents that are suitable for preparing carboxylate ester (1). Alternatively, a carboxy group on the core organic material can be reacted with thionyl chloride or oxalyl chloride in the presence of a base catalyst to form a core organic material having a chlorocarbonyl group. The chlorocarbonyl group can be reacted with a hydroxy group on the dendron (i.e., the dendron is an alcohol) in the presence of a weak base such as pyridine or DMAP.

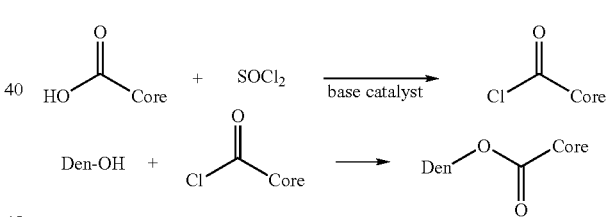

Amide linkages can be prepared using reactions similar to those used to prepare carboxylate esters. However, in the above reactions, a primary or secondary amine would be used in place of an alcohol as the nucleophile. More specifically, a dendron having a carboxy group (i.e., the dendron is a carboxylic acid) can be reacted with a core organic material having an amino group (i.e., the core organic material is an amine) to form amide (2).

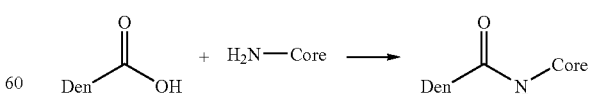

Alternatively, a dendron having an amino group (i.e., the dendron is an amine) can be reacted with a core organic material having a carboxy group (i.e., the core organic material is a carboxylic acid) to form amide (1).

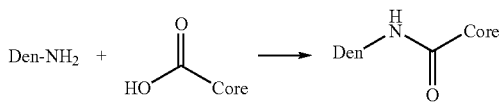

As with the carboxylate esters, the carboxy groups can be converted to chlorocarbonyl groups prior to reaction with an amine.

Thioester linkages can be prepared using similar reactions to those used to form carboxylate esters and amides. However, a mercaptan is used in place of an alcohol or amine as the nucleophile. More specifically, a dendron having a carboxy group (i.e., the dendron is a carboxylic acid) can be reacted with a core organic material having a mercapto group (i.e., the core organic material is a mercaptan) to form thioester (1).

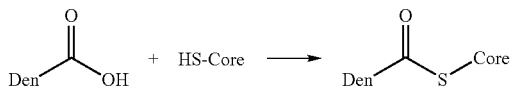

Alternatively, a dendron having a mercapto group (i.e., the dendron is a mercaptan) can be reacted with a core organic material having a carboxy group (i.e., the core organic material is a carboxylic acid) to form thioester (2).

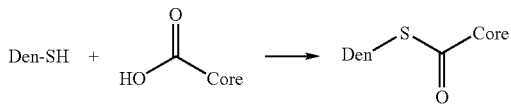

In yet other embodiments, the Den-A-Core linkage is an anhydride. Such a linkage can be formed by initially reacting a carboxy group on a dendron with thionyl chloride or oxalyl chloride in the presence of a base catalyst to form a dendron having a chlorocarbonyl group. The chlorocarbonyl group then can be reacted with a carboxy group on the core organic material in the presence of a weak base such as DMAP or pyridine.

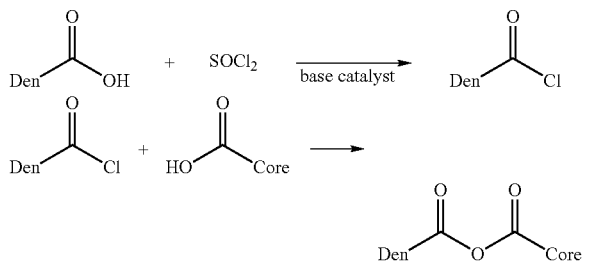

Alternatively, a carboxy group on the core organic material can be reacted with thionyl chloride or oxalyl chloride in the presence of a base catalyst to form a core organic material having a chlorocarbonyl group. The chlorocarbonyl group can be reacted with a carboxy group on the dendron to form an anhydride linkage.

Some other Den-A-Core linkages are siloxanes. Reacting a chlorosilyl group of a chlorosilane core organic material with a dendron that is an alcohol can form siloxane (2). The reaction is usually conducted in the presence of a base (e.g., triethylamine, imidazole, sodium hydroxide, or the like). Each $R^d$ group of the chlorosilyl group can be independently selected from an alkyl, aryl, or alkoxy group.

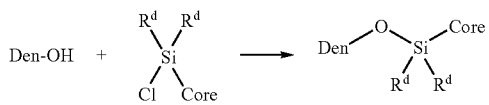

Alternatively, reacting a trifluoromethylsulfonatesilyl group of a trifluormethylsulfonate silane core organic material with a dendron having a hydroxy group can form a siloxane (2) linkage. The reaction is usually conducted in the presence of a base. Each $R^d$ group of the trifluoromethylsulfonatesilyl group can be independently selected from an alkyl, aryl, or alkoxy group.

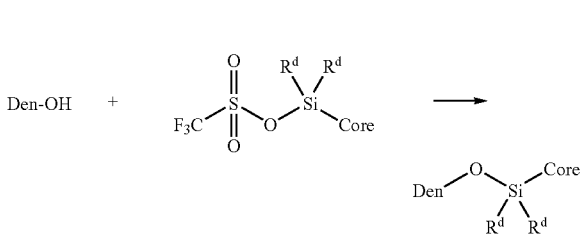

Similarly, reacting a chlorosilane or a trifluoromethylsulfonate silane dendron with a core organic material that is an alcohol can form siloxane (1).

Carbamate linkages can be formed, for example, by reacting an alcohol with an isocyanate. The isocyanato group can be on either the core organic material or the dendron as shown in the following reactions.

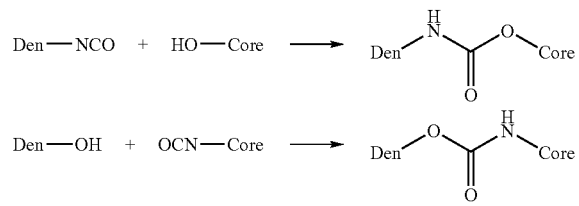

Thiocarbamate-S-ester linkages can be formed using similar reactions to those used to form carbamate linkages. Mercapto groups rather than hydroxy groups on the core or dendron can be reacted with an isocyanato group.

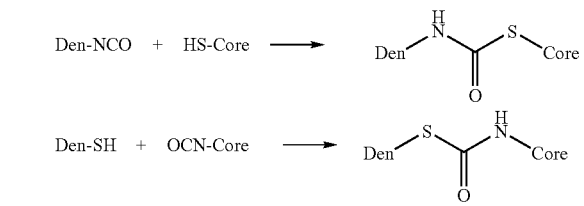

Either the core organic material or the dendron can be a mercaptan. These thiocarbamate-S-esters can be easier to cleave than carbamates and thiocarbamate-O-esters.

Sulfonamide linkages can be formed by reacting an amino group with a chlorosulfonyl group in the presence of a mild base such as DMAP or pyridine. Either the core organic material or the dendron can be an amine.

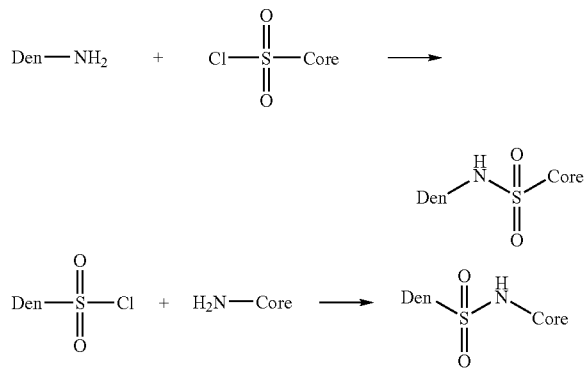

Phosphoramidate linkages can be formed by first reacting an alkyl dichlorophosphate (e.g., ethyldichlorophosphate) with an alcohol in the presence of a mild base such as pyridine or DMAP to form a chlorophosphono group. The chlorophosphono group can then be reacted with an amine. In some examples, the core organic material is an alcohol and the dendron is an amine.

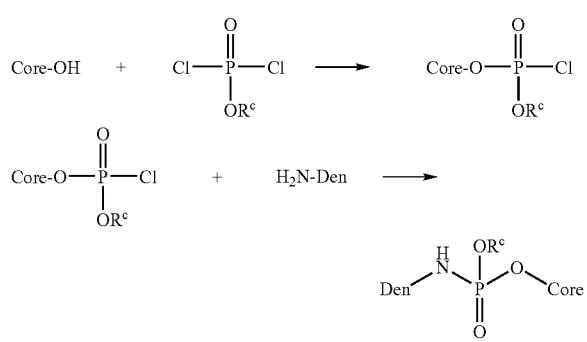

In other examples, the dendron is an alcohol and the amino group is on the core organic material.

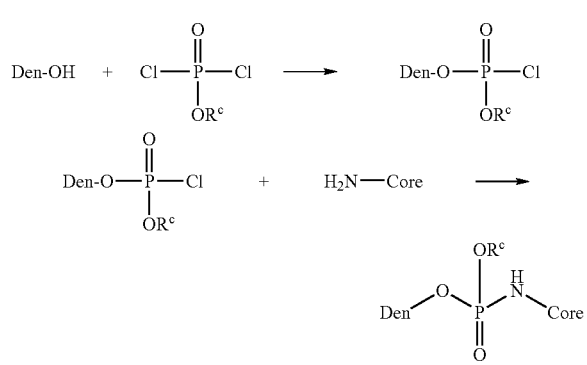

Phosphoramidite linkages can be formed by first reacting an alkyl dichlorophosphite (e.g., ethyldichlorophosphite) to produce a chlorophosphito group in the presence of a mild base such as pyridine or DMAP. The chlorophosphito group can be reacted with an amino group. In some examples, the amino group is on the dendron (i.e., the dendron is an amine and the core organic material is an alcohol).

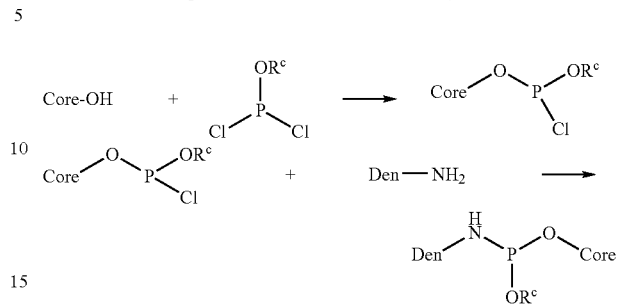

Alternatively, the amino group can be on the core organic material and the dendron is an alcohol that reacts with the alkyldichlorophosphite.

Dithiocarbonate (i.e., xanthate) linkages can be formed by reacting a halo group with a salt of a dithiocarbonic acid-O-ester. In some examples, the halo group is on the dendron.

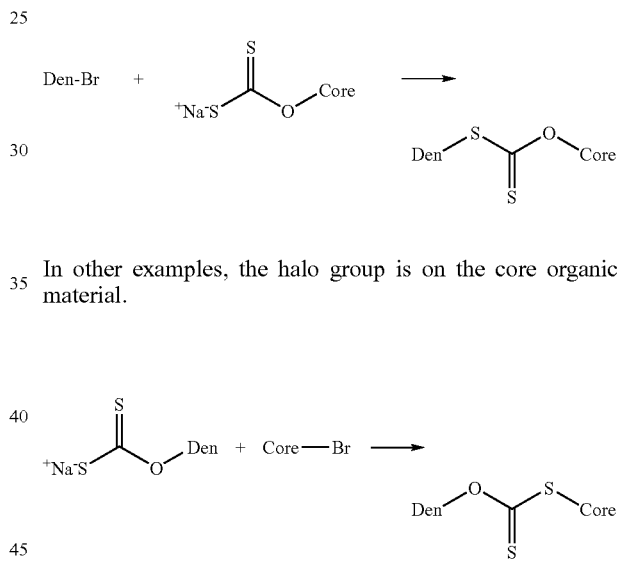

In other examples, the halo group is on the core organic material.

A phosphonate linkage can be formed by reacting a hydroxy group and a phosphono group using Mitsunobu esterification conditions (e.g., in the presence of $PPh_3$ and either DEAD or DIAD). In some examples, the hydroxy group is on the dendron (i.e., the dendron is an alcohol and the core organic material is a phosphonate).

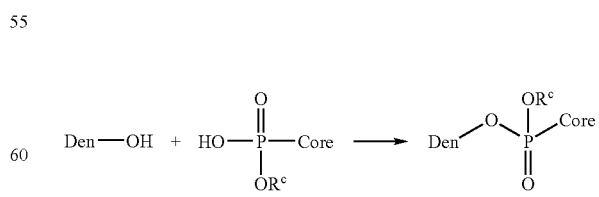

In other examples, the hydroxy group is on the core organic material (i.e., the core organic material is an alcohol and the dendron is a phosphonate).

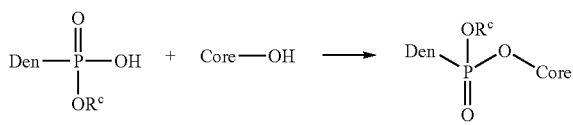

Boronic ester linkages can be formed by reacting a boronic acid with a core organic material having at least two hydroxy groups. The boronic ester includes two covalent bonds to the core organic material.

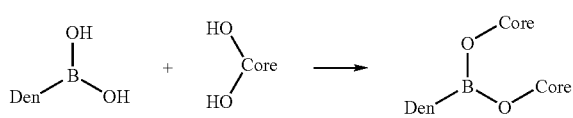

After attachment of the dendron to the core organic material, the dendrons are crosslinked to form a crosslinked dendrimer. Each dendron has at least two crosslinkable group that can be used to crosslink one dendron to at least one other dendron. Each dendron is crosslinked to at least one or two other dendrons. When the dendrimer is prepared from two dendrons, there are two crosslinks between the first dendron and the second dendron. When the dendrimer is prepared from three or more dendrons, a first dendron can be crosslinked to a second dendron and to a third dendron. That is, when there are three or more dendrons in a dendrimer, each dendron is usually crosslinked to two other dendrons.

A first dendron has at least two first crosslinkable groups and a second dendron has at least two second crosslinkable groups. To form a crosslinked dendrimer, the first crosslinkable groups and the second crosslinkable groups are reacted. The first and second crosslinkable groups can be reacted with each other or with other crosslinkable groups. In some examples, such as in dendrimers that are formed from only two dendrons, two of the first crosslinkable groups are crosslinked with two of the second crosslinkable groups. In some other examples, such as in dendrimers that are formed from at least three dendrons, one of the first crosslinkable groups on the first dendron is crosslinked with one of the second crosslinkable groups on the second dendron, one of the first crosslinkable groups on the first dendron is reacted with a crosslinkable group on the third dendron, and one of the second crosslinkable groups on the second dendron is reacted with a crosslinkable on a third dendron. This example is shown in Reaction Scheme A.

Additionally, a molecular chain of one dendron can be crosslinked to another molecular chain of the same dendron. Some dendrons have two, three, four, five, six, seven, eight, nine, ten, or more than ten crosslinkable groups. Within a dendron, the crosslinkable group can be located along the length of a molecular chain or at an outermost periphery of a molecular chain (e.g., as shown in Reaction Scheme A). In some embodiments, a dendron has a crosslinkable group at the outermost periphery of each outer molecular chain (i.e., at the end of each outer branch of the dendron as shown in Reaction Scheme A).

The crosslinkable groups can be reacted to form reversible or irreversible crosslinks. The crosslink density is sufficiently high to prevent the disassembly of the dendritic structure upon removal of the core organic material. That is, the crosslinks allow the crosslinked dendrimer to remain intact even after removal of the central core organic material in the process of forming a cored dendrimer. On the other hand, the crosslink density is sufficiently low to allow subsequent removal of the core organic material without disrupting the crosslinks. Additionally, the crosslink density is sufficiently low to allow a metal-containing precursor and other reagents to enter into the cored dendrimer.

In one method of forming the crosslinks, a first crosslinkable group reacts directly with a second crosslinkable group. In another method of forming the crosslinks, a difunctional crosslinking compound is reacted with both the first crosslinkable group and the second crosslinkable group.

In the following formulas, $Den_1$ denotes the first dendron exclusive of one of the first crosslinkable groups while $Den_2$ denotes the second dendron exclusive of one of the second crosslinkable groups. Each $Den_1$ and $Den_2$ is also attached to the core organic material. For ease of describing the crosslinking reactions, the core organic material is not included in the reactions. Each $Den_1$ and $Den_2$ includes at least one other crosslinkable group. For ease of describing the crosslinking reactions, only one crosslinkable group is included in the reactions.

Various chemical approaches can be used to form a crosslink by directly reacting a first crosslinkable group with a second crosslinkable group. In a first example, a metathesis catalyst can be added to crosslink two alkene groups as shown in the following reaction.

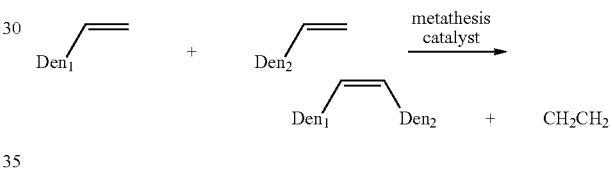

Exemplary metathesis catalysts include, but are not limited to, ruthenium, molybdenum, tungsten, or rhenium complexes. The alkenes are often monofunctional. Replacing a hydrogen atom on the alkenyl group tends to decrease the rate of the crosslinking reaction.

Another example of directly reacting the crosslinkable groups involves a [2+2] cycloaddition reaction in the presence of light.

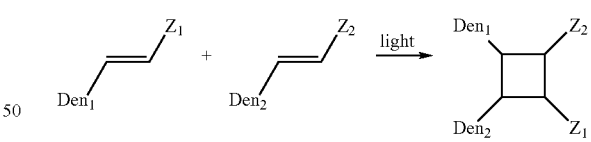

The reactants can be stilbenes (e.g., $Z_1$ and $Z_2$ are phenyl), cinnamates (e.g., $Z_1$ and $Z_2$ are carboxy or carboxylate groups), or uracils. In a more specific example, the reactants are uracils such as described further in Tominaga et al., *Chemistry Letters*, 374-375 (2000).

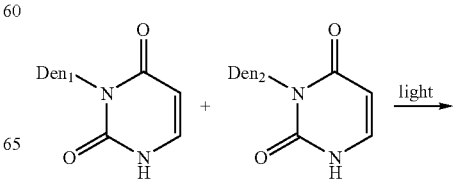

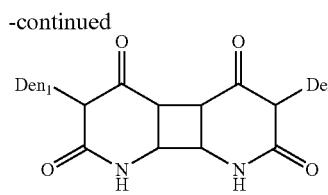

Additionally, the crosslinkable groups can be directly reacted using typical polymerization reactions. For example, acrylates, methacrylates, acrylamides, and methacrylamides can be crosslinked in the presence of a thermal of photo initiator.

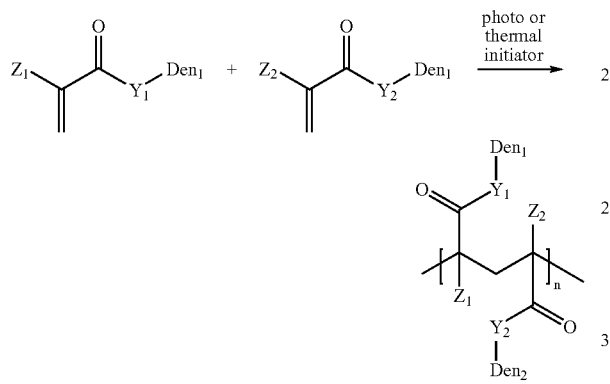

In this reaction, $z_1$ and $z_2$ are each independently hydrogen or methyl; $Y_1$ and $Y_2$ are each independently oxygen or $NR^c$ where $R^c$ is hydrogen, alkyl, aryl, or heterocycle; and n is an integer of 1 to 100. In other polymerization crosslinking reactions, vinyl ethers or vinyl esters can undergo a cationic polymerization reaction as shown below where n is an integer of 1 to 100.

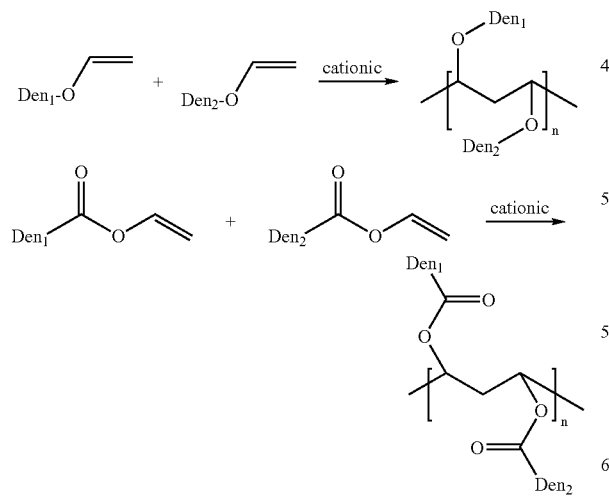

In yet other polymerization crosslinking reactions, epoxides can undergo ring-opening polymerization reactions in the presence of an acid or amine catalyst where n is an integer of 1 to 100.

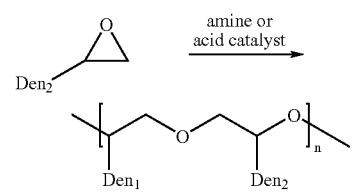

Another method of crosslinking dendrons involves the formation of a coordinative crosslink with a metal species. Both the first and second crosslinkable groups ligate to a single metal species. For example, phenanthrenyl groups can form a coordinative crosslink in the presence of a metal salt (M) such as a copper salt.

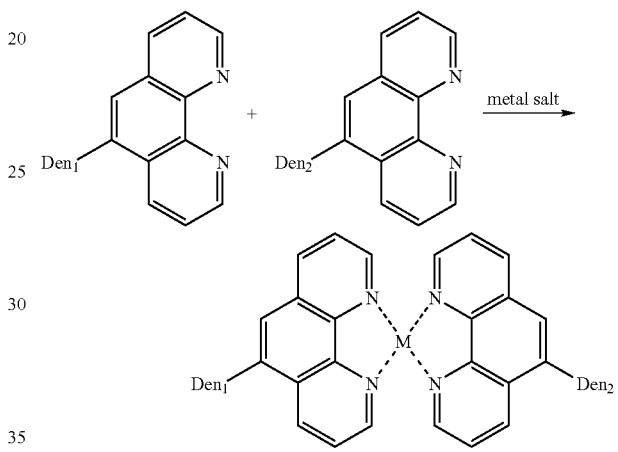

As another example of a direct reaction, each crosslinkable group can be a cyclobutylphenyl group. Upon heating, two such groups can form a tricyclic structure as depicted in the following reaction.

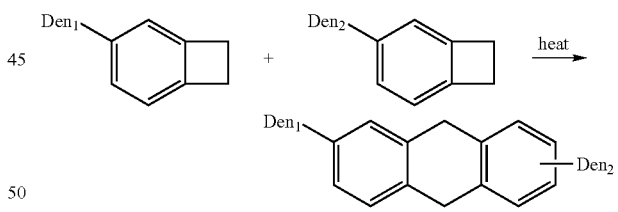

In the above crosslinking reactions, a first dendron is crosslinked to a second dendron. The first dendron and the second dendron are often part of the same dendritic structure (i.e., the dendrons that are crosslinked are attached to the same core organic material). However, in some examples, the dendrons that are crosslinked are in different dendritic structures (i.e., the dendrons that are crosslinked are not attached to the same core organic material). When it is desired that the crosslinking is between dendrons attached to the same core organic material, the crosslinking reactions often occur in a medium with a relatively low amount of the dendrimer to minimize the interactions between different dendritic structures.

In the second method of forming a crosslinked dendrimer, various multifunctional (e.g., difunctional) crosslinking agents can be used to join two dendrons. The crosslinking agent can react with both the first crosslinkable group and the second crosslinkable group. In some embodiments, the crosslinking agent is a nucleophile and the crosslinkable groups are electrophiles. Alternatively, the crosslinking agent is an electrophile and the crosslinkable groups are nucleophiles. Suitable crosslinking agents include difunctional activated carbonyls, difunctional azlactones, difunctional isocyanates, difunctional silanes, difunctional siloxanes, difunctional alkylhalides, difunctional arylhalides, difunctional aldehydes, difunctional ketones, difunctional aryl cupric halides, difunctional (meth)acrylates, difunctional (meth)acrylamides, difunctional alcohols, difunctional amines, difunctional compounds having hydroxy and amino groups, difunctional compounds having hydroxy and mercapto groups, difunctional compounds having mercapto and amino groups, difunctional alkylenes, difunctional conjugated dienes, difunctional β-ketones, difunctional β-keto esters, difunctional β-keto amides, and the like. As used herein, the term "difunctional" refers to two functional groups of the type characteristic of the named compound. For example, a difunctional amine has two amino groups and a difunctional isocyanate has two isocyanato groups.

In some examples, the crosslinking agent is a difunctional carboxylic acid, or a difunctional, activated carbonyl such as a difunctional carboxylic acid halide, difunctional anhydride, or difunctional succinimide ester. Such a crosslinking agent can be reacted with hydroxy crosslinkable groups, amino crosslinkable groups, or mercapto crosslinkable groups on dendrons as exemplified by the following reactions.

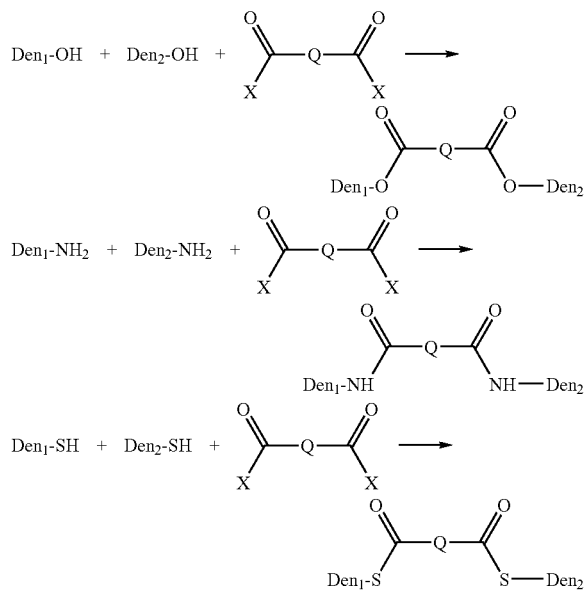

In these reactions, X is independently selected from chloro, bromo, hydroxy, acyloxy, or oxysuccinyl; and Q is a connecting group that is aliphatic, aromatic, heterocyclic, or a combination thereof. Although the crosslinkable groups shown in these equations are the same, the crosslinkable groups can be different (i.e., each crosslinkable group can be independently selected from an amino, hydroxy, and mercapto groups). Alternatively, the crosslinking agent can have two functional groups independently selected from amino, mercapto, and hydroxy groups with crosslinkable groups selected from halocarbonyl, carboxy, acyloxycarbonyl, or succinyloxycarbonyl groups.

In other examples, the crosslinking agent is a difunctional azlactone. Such a crosslinker could be reacted with amino crosslinkable groups or hydroxy crosslinkable groups as exemplified by the following reactions.

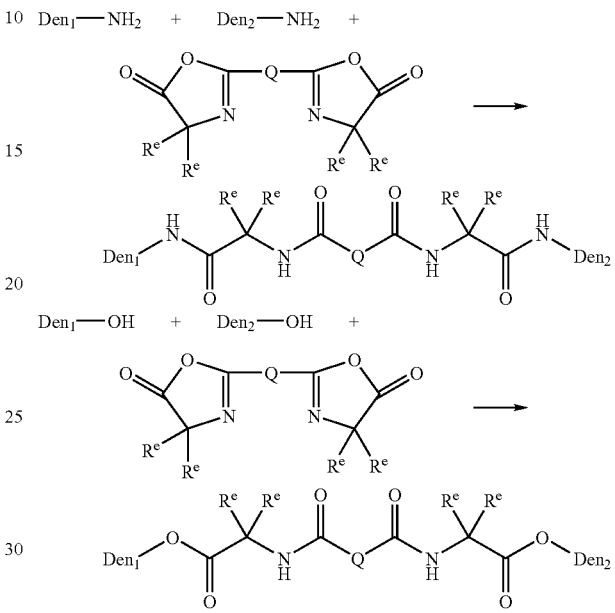

Each $R^e$ group is independently hydrogen, alkyl, or aryl; and Q is a connecting group that is aromatic, aliphatic, heterocyclic, or a combination thereof. Although the crosslinkable groups shown in these equations are the same, one crosslinkable group can be a hydroxy and the other crosslinkable group can be an amino. Alternatively, the dendrons can be azlactones and the crosslinking agent can have two functional groups independently selected from an amino and hydroxy groups. In both types of examples, the crosslinked reaction product is an ester or amide.

In still other examples, the crosslinking agent is a difunctional isocyanate and the crosslinkable groups are amino groups or hydroxy groups.

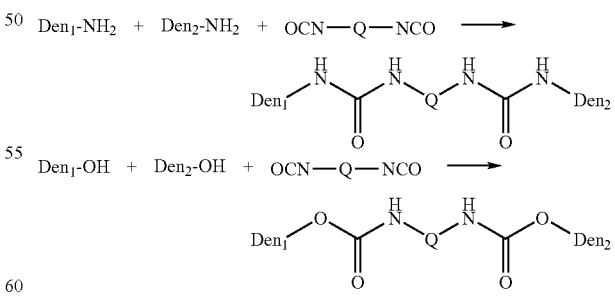

In these reactions, Q is a connecting group that is aromatic, aliphatic, heterocyclic, or a combination thereof. Although the crosslinkable groups shown in these equations are the same, one crosslinkable group can be a hydroxy and the other crosslinkable group can be an amino. Alternatively, the crosslinkable groups can be isocyanto groups and the crosslinking agent can have two functional groups independently selected from hydroxy and amino groups. In both types of examples, the crosslinked reaction product is a urea or urethane.

A difunctional silyl-containing crosslinking agent can be reacted with alkenyl groups in the presence of a palladium catalyst.

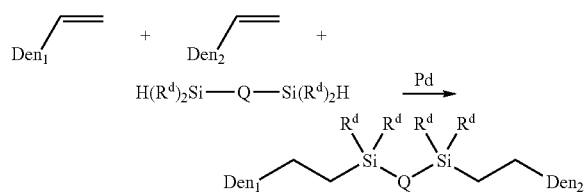

In this reaction, each $R^d$ is independently an alkyl, aryl, or alkoxy group; and Q is a connecting group that is aromatic, aliphatic, heterocyclic, or a combination thereof. Alternatively, the crosslinking agent can be a difunctional alkene (i.e., two carbon-carbon double bonds) and the crosslinkable groups can be silyl groups of formula —Si($R^d$)$_2$H where $R^d$ is the same as defined above. In both of these examples, the crosslinked reaction product is a silane.

A dihalogenated alkane crosslinking agent can be reacted with hydroxy, amino, or mercapto groups as exemplified in the following reaction where the crosslinkable group is a hydroxy.

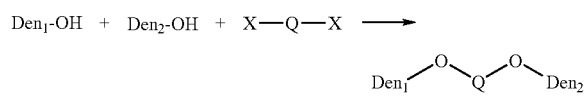

In this reaction, each X is independently bromo, chloro, fluoro, or iodo; and Q is a connecting group that is aromatic, aliphatic, heterocyclic, or a combination thereof. Although both dendrons in this reaction have the same crosslinkable group, each crosslinkable group can be independently selected from hydroxy, amino, or mercapto groups. In complementary examples, the crosslinking agent has two functional groups independently selected from amino, mercapto, and hydroxy groups and each crosslinkable group is a haloalkyl.

A difunctional aldehyde or difunctional ketone crosslinking agent can be reacted with amino groups to form an imine as shown in the following reaction where each $R^c$ is independently hydrogen, alkyl, aryl, or heterocycle and Q is a connecting group that is aromatic, aliphatic, heterocyclic, or a combination thereof.

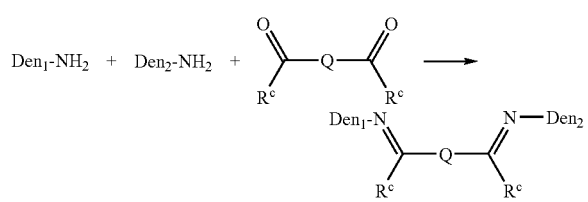

In complementary examples, the crosslinking agent is a difunctional amine and the crosslinkable groups are independently selected from formyl or acyl groups.

Aryl halide crosslinkable groups can react with a difunctional aryl halide that has been treated with copper to produce a difunctional aryl cupric halide crosslinking agent using an Ullman reaction. In this reaction, X is halo and Q is a connecting group that is aromatic, aliphatic, heterocyclic, or a combination thereof.

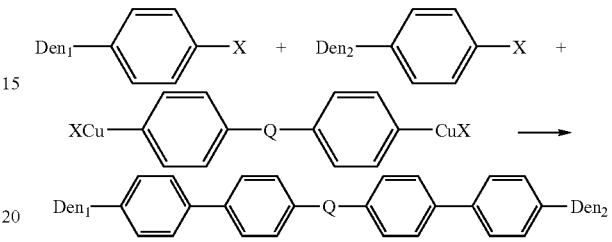

Crosslinks can also be formed using Michael addition reactions. In a first example, the crosslinkable groups can be amino, hydroxy, or mercapto groups and the crosslinking agent can be a difunctional (meth)acrylate (i.e., difunctional acrylate or difunctional methacrylate) or difunctional (meth)acrylamide (i.e., difunctional acrylamide or difunctional methacrylamide). Such a reaction is shown in the following reaction for amino crosslinkable groups and a difunctional acrylamide crosslinking agent.

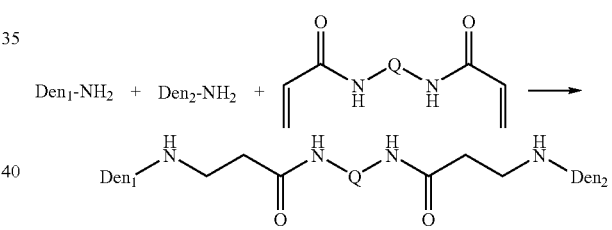

In a second example, the crosslinkable group can be a β-diketone, β-diketo ester, or β-diketo amide and the crosslinking agent can be a difunctional (meth)acrylate or a difunctional (meth)arylamide. Such a reaction is shown in the following reaction for a difunctional acrylamide crosslinking agent and a β-diketone.

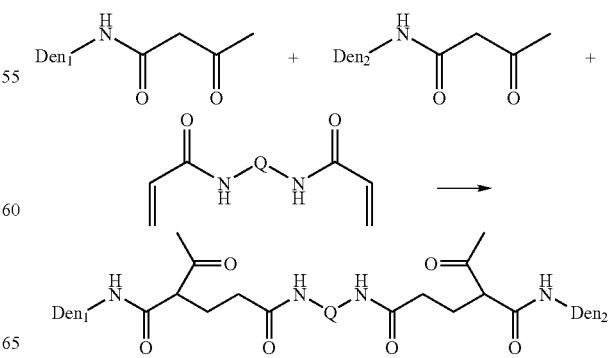

In these reactions, Q is a connecting group selected from an aromatic group, aliphatic group, heterocyclic group, or a combination thereof.

A crosslink can be formed using a Diels-Alder reaction. That is, two crosslinkable groups that are dienes can react with a crosslinking agent that is a difunctional dienophile (i.e., there are two carbon-carbon double bonds). An example is shown in the following reaction.

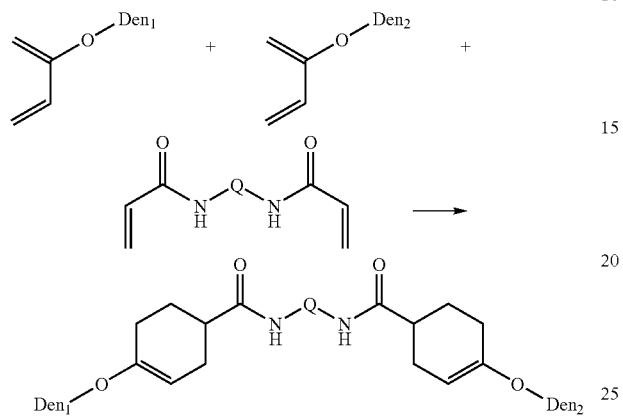

In this reaction, Q is a connecting group selected from an aromatic group, aliphatic group, heterocyclic group, or a combination thereof.

After formation of the crosslinked dendrimer, the attachment groups linking the dendrons to the core organic material are chemically cleaved. The core organic material or a derivative of the core organic material is removed from the crosslinked dendrimer. The structure remaining after removal of the core organic material or the derivative of the core organic material is the cored dendrimer. The cored dendrimer is a crosslinked polymeric material that is at least partially hollow in the central, internal region. The cored dendrimer has interior end groups that are capable of forming a coordinative bond or an ionic bond with a metal-containing precursor such as, for example, a metal ion.

The core organic material can typically be freed from the crosslinked dendrimer after cleavage of the attachment group. In some examples, however, the core organic material is further degraded such as through hydrolysis or reduction reactions to allow more facile passage of the core organic material from the interior of the crosslinked dendrimer. After removal of the core organic material from the crosslinked dendrimer to form a cored dendrimer, additional regions of the dendrons within the interior of the cored dendrimer can be removed and/or further modified such as through hydrolysis or reduction reactions. The removal of the core organic material corresponds to the removal of the zero generation of the dendrimer. Additional generations also can be removed such as, for example, the first generation or the first generation plus the second generation from higher generation dendritic structures.

The cored dendrimer remains intact after removal of the core organic material due, at least in part, to the existence of the crosslinks of one dendron to another dendron, the existence of crosslinks between the molecular chains of a single dendron, or combinations thereof. The organic material removed from the crosslinked dendrimer that results in the formation of a cored dendrimer typically does not involve the removal of the crosslinks between dendrons or between molecular chains of a dendron. At least one generation of the original dendrons used to form the dendritic structure remain in the cored dendrimer. The cored dendrimer is often a polymeric sphere that is crosslinked. The central interior region of the crosslinked polymeric sphere is free of organic material.

The lowest generation of the dendritic structure that remains after removal of the core organic material or a derivative thereof has reactive groups that are referred to as the interior end groups of the cored dendrimer or end groups within the interior of the cored dendrimer. The end groups within the interior of the cored dendrimer are often a carboxy, hydroxy, amino, mercapto, sulfono, sulfamino, phosphono, phosphonamino, phosphate, borono, silanol, formyl, or acyl group. There are at least two end groups within the interior of the cored dendrimer and these end groups can be the same or different.

In some embodiments, cleavage of the attachment group and removal of the core organic material or a derivative thereof results in the formation of a carboxy group as an end group of a cleaved dendron within the interior of the cored dendrimer. The cleaved dendron refers to the generations of the dendron that remain after chemical cleavage of the attachment group. The cleaved dendron is of formula

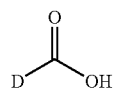

where D represents the region of the dendron exclusive of the interior end group that remains in the central region of the cored dendrimer. Carboxy end groups within the interior of a cored dendrimer can be formed under mild hydrolytic conditions from a Den-A-Core linkage such as carboxylate ester (1), an anhydride, a succinimide ester, thioester (1), or mixed anhydride (1) of carboxylic acid and sulfonic acid. The carboxy end groups can also be formed under strong acid or strong base conditions from amide (2). Additionally, a carboxy end group within the interior of the cored dendrimer can be formed from photolytically labile ester linkages by exposure to suitable actinic radiation.

In other embodiments, cleavage of the attachment group results in the formation of a hydroxy group as the end group of a cleaved dendron within the interior of the cored dendrimer. That is, the cleaved dendron is of formula

where D represents the region of the dendron exclusive of the interior end group that remains in the central region of the cored dendrimer. Hydroxy end groups can be formed, for example, by exposing sulfonate (1), phosphonate (1), phosphate, carbonate, sulfamide (1), phosphoramidate (1), carboxylate ester (2), or siloxane (2) to mild hydrolysis conditions. Siloxane (2) can also be cleaved with fluoride salts such as tetrabutyl ammonium fluoride. Hydrolyzing carbamate (1), dithiocarbamate-O-ester (2), or thiocarbamate-O-ester (2) in the presence of a strong base can generate a hydroxy end group. Additionally, a peroxide can generate a hydroxy end group when exposed to heat or to a radical source.

In other embodiments, cleavage of the attachment group results in the formation of an amino group as the end group of the cleaved dendron within the interior of the cored dendrimer. That is, the cleaved dendron is of formula

where D represents the region of the dendron exclusive of the interior end group that remains in the central region of the cored dendrimer. Amino end groups can be formed in the interior of the dendrimer by hydrolysis (e.g., under relatively strong conditions) or by reduction (e.g., using reagents such as NaBH$_4$, LiAlH$_4$, or the like) of amide (1), thioamide, carbamate (2), thiocarbamate-O-ester (1), dithiocarbamate (1), thiocarbamate-S-ester (1), sulfonamide (1), sulfamide (2), or silazane (1). Phosphoramidite (1) and phosphoramidate (2) can be cleaved by alcohols or water under mild conditions. Additionally, amino end groups can be formed by photolytically labile carbamates. Amino end groups can also be formed by cleaving an ester with hydrazine.

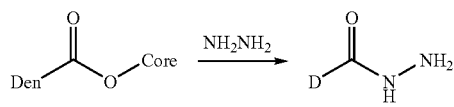

In still other embodiments, cleavage of the attachment group can result in the formation of a mercapto group as the end group of the cleaved dendron within the interior of the cored dendrimer. That is, the cleaved dendron can be of formula

D-SH where D represents the region of the dendron exclusive of the interior end group that remains in the central region of the cored dendrimer. Mercapto end groups can be formed from, for example, thioesters (2), dithioesters, thiophosphonates, thiophosphonamides, and dithiocarbonates (1) by cleaving the attachment group under mild to strong hydrolysis conditions. Thiocarbamates-S-esters (2) and dithiocarbamates (2) can be cleaved using strong hydrolysis conditions or mild reduction conditions similar to those used to generate amino end groups. Disulfides can be cleaved using reduction conditions to provide mercapto end groups.

Additionally, cleavage of the attachment group can result in the formation of a sulfono group as the end group of the cleaved dendron in the interior of the cored dendrimer. That is, the cleaved dendron is of formula

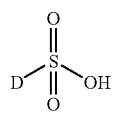

where D represents the region of the dendron exclusive of the interior end group that remains in the central region of the cored dendrimer. These end groups can be formed from sulfonate (2) and mixed anhydride (2) under mild hydrolysis conditions. Mild hydrolysis conditions also can be used to form sulfamino end groups

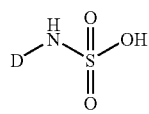

from sulfamides (2).

Cleavage of the attachment group can result in the formation of a phosphono group as the end group of the cleaved dendron in the interior of the cleaved dendrimer. That is, the cleaved dendron is of formula

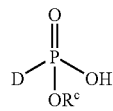

where D represents the region of the dendron exclusive of the interior end group that remains in the central region of the cored dendrimer and R$^c$ is a hydrogen, alkyl, aryl, or heterocycle. The phosphono group can be formed from phosphonates (2) using mild hydrolysis conditions. Mild hydrolysis conditions can also be used to form phosphonamino end groups

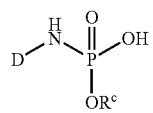

from phosphoramidates (2) or form phosphate end groups

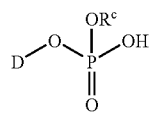

from phosphormidites (2).

End groups within the interior of a cored dendrimer can be a borono

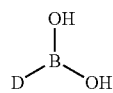

generated by hydrolysis of the corresponding boronic ester in water. D represents the region of the dendron exclusive of the interior end group that remains in the central region of the cored dendrimer.

Additionally, silanols

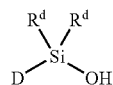

can be formed where D represents the region of the dendron exclusive of the interior end group that remains in the central region of the cored dendrimer and each R$^d$ is independently an alkyl, aryl, or alkoxy. Silanols can be generated by hydrolysis of the corresponding siloxanes (1) in water or by cleavage with tetrabutylammonium fluoride. Additionally, silanols can be formed from silazanes (2) with a strong base.

The end groups of dendrons within the interior of the cored dendrimer can be an acyl or formyl group

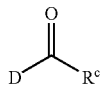

where $R^c$ is hydrogen, alkyl, aryl, or heterocycle and D represents the region of the dendron exclusive of the interior end group that remains in the central region of the cored dendrimer. Various chemistries can be used to generate an acyl or formyl end group. For example, imines can be hydrolyzed using mild conditions. Additionally, acetals can be cleaved with a dilute acid (e.g., dilute hydrochloric acid) in a solvent such as acetone. Further, a cis- or trans-disubstituted alkene can be subjected to oxidative conditions (e.g., ozonolysis or various oxidizing agents such as sodium iodinate, etc.).

Post-cleavage modification reactions can be used to provide end groups for the dendrons within the cored dendrimer that are capable of attracting a metal-containing precursor. For example, an activated ester can be treated with ammonia or ammonium hydroxide to generate an amide. The subsequently formed amide can be subjected to reduction conditions (e.g., $NaBH_4$) to form an amine.

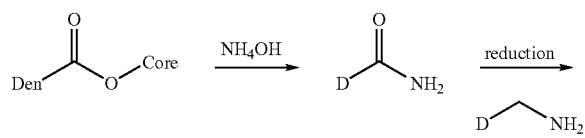

In another example of a post-cleavage modification reaction, an ester can be hydrolyzed to an alcohol.

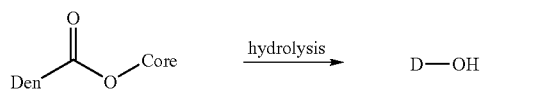

The subsequently formed alcohol can be reacted with an acid chloride (e.g., acetoacetic acid chloride) to provide other functionality such as, for example, an acetoacetyl group).

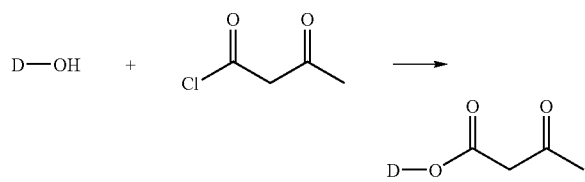

An alcohol can also be reacted with $PCl_3$ or $P_2O_5$ to produce a phosphate.

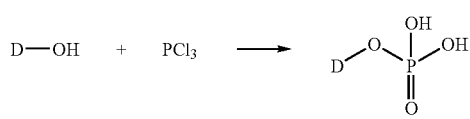

The interior end groups within the cored dendrimer are capable of forming a coordinative bond or an ionic bond with a metal-containing precursor such as a salt containing a metal ion. In some embodiments, the pH is adjusted to convert the interior end group to an ionic form. For example, the pH can be raised to form the corresponding ionic base of an acid end group and the pH can be lowered to form the corresponding ionic acid of a base end group. The metal-containing precursor can be subsequently reacted to form a semiconductor particle within the cored dendrimer. That is, the cored dendrimer functions as a template for the preparation of semiconductor particles. The semiconductor particle forms within the cored dendrimer in the central interior region that is free of organic material.

In some embodiments, only the interior end groups formed after removal of the core organic material or a derivative thereof are capable of forming a bond with a metal-containing precursor. The cored dendrimer tends to be free of other groups that can bond with the metal-containing precursor.

The metal-containing precursor contains a chemical species or compound that can form a bond such as a coordinative bond or an ionic bond with the interior end groups of the cored dendrimer. Mixtures of metal-containing precursors can be used. After forming a bond with the interior end group within the cored dendrimer, the metal-containing precursor is precipitated to form a semiconductor particle within the central interior region of the cored dendrimer. The semiconductor particle usually contains a metal chalcogenide (e.g., a metal sulfide, metal selenide, metal telluride, or a combination thereof).

The metal-containing precursor is often in the form of a salt that contains a metal species. The salt is usually soluble in water or a polar solvent. A solution of the metal-containing species can be exposed to the cored dendrimer. The metal-containing species can be coordinated to the interior end groups within the cored dendrimer. The localized metal-containing species can then be reacted with a chalcogenide source (e.g., a source of sulfide, selenide, telluride, or a combination thereof) to form a semiconductor particle. The metal-containing species precipitates as a metal chalcogenide.

For example, a first ionic metal-containing species can form a bond (e.g., a coordinative bond or an ionic bond) with the interior end group within the central region of the cored dendrimer. Suitable first ionic metal-containing species can be formed by dissolving, for example, a cadmium salt, a zinc salt, a lead salt, and the like. Exemplary salts include, but are not limited to, metal nitrate salts such as cadmium nitrate, zinc nitrate, and lead nitrate. Once the first metal-containing species have been localized, a second ionic species such as a chalcogenide source can be added. Suitable chalcogenide source include, for example soluble sulfide salts (e.g., sodium sulfide), soluble selenide salts (e.g., sodium selenide), soluble telluride salts (e.g., sodium telluride), and combinations thereof. Other suitable chalcogenide sources include acids such as, for example, hydrogen sulfide, hydrogen selenide, hydrogen telluride, and combinations thereof. The addition of the second ionic species to the first metal-containing species results in the precipitation of a metal chalcogenide within the central region of the cored dendrimer. Such a method can be used to form, for example, semiconductor particles such as, for example, cadmium sulfide, cadmium selenide, cadmium telluride, zinc sulfide, zinc selenide, zinc telluride, lead sulfide, lead selenide, and lead telluride. Alloys of these materials also can be formed.

The reactions to bond the metal-containing species to the interior end group in the central region of the cored dendrimer and to precipitate the bonded metal-containing species by the addition of a chalcogenide source are typically conducted in water, a polar solvent, or a solvent mixture such as a biphasic system. The reactions often occur at room temperature (e.g., 20 to 25° C.) or at a temperature up to about 100° C.

In some embodiments, the cored dendrimer can be removed after the formation of the semiconductor particles. The cored dendrimer can be dissolved, for example, in an organic solvent that does not dissolve the semiconductor particles.

In a second aspect, a composite particle is provided that includes a semiconductor particle within a central interior region of a cored dendrimer. The cored dendrimer has crosslinked dendrons surrounding the central interior region and the central interior region is free of organic material. The semiconductor particle has a size that is greater than the central interior region of the cored dendrimer and that is no greater than an outer dimension of the cored dendrimer.

The cored dendrimers of the composite particles are crosslinked polymeric spheres that are free of organic material in the central region of the sphere. The cored dendrimer is formed by removing an interior region of a crosslinked dendrimer after cleavage of the attachment groups between the core organic material in the central region and the dendrons. The cored dendrimers contain $n^{th}$ generation material (i.e., n is an integer of 2 to 20) with at least some of the lower generations of material removed. For example, some cored dendrimers can have the zero generation removed, the zero and first generation removed, or the zero, first, and second generations removed.

The cored dendrimer contains a plurality of crosslinks between the dendrons and optionally between the individual molecular chains within a dendron. The crosslinking of the individual outer molecular chains tends to produce a cored dendrimer that is robust. The crosslink density tends to be low enough for passage of metal-containing precursor and other reactants used to form the semiconductor particles into the interior of the cored dendrimer.

The growth of the semiconductor particles within the cored dendrimer is usually limited by the location of the crosslinks. The crosslinks tend to hinder the further growth of the semiconductor particles. The semiconductor particles can have dimensions corresponding to the cored dendrimer where the crosslinks are at the outer periphery of the dendron molecular chains. That is, the size of the cored dendrimer often defines the maximum size of the semiconductor particles. When the cored dendrimer has crosslinks at locations other than at the periphery of the dendron molecular chains (i.e., the crosslinks are along the length of the branches within the dendron), the location of the crosslinks tends to define the maximum size of the semiconductor particles formed within the cored dendrimer. In some embodiments, the semiconductor particles have a size that is larger than the central region of the cored dendrimer that is free of organic material.

In some embodiments, semiconductor particles may be prepared of a size that is greater than the size of a single cored dendrimer. In this embodiment, the semiconductor particle may be associated with more than one cored dendrimer. That is, the semiconductor particle can form a composite with more than one cored dendrimer.

The mean average particle size is typically less than 100 nanometers. In some embodiments, the mean average particle size is less than 80 nanometers, less then 60 nanometers, less than 50 nanometers, less than 40 nanometers, less than 30 nanometers, less than 20 nanometers, or less than 10 nanometers. The mean average size is usually no less than 0.1 nanometers, no less than 0.2 nanometers, no less than 0.5 nanometers, no less than 1 nanometer, or no less than 2 nanometers. For example, the mean average particle size can be in the range of 0.1 to 100 nanometers, in the range of 0.5 to 50 nanometers, in the range of 0.5 to 40 nanometers, in the range of 0.5 to 30 nanometers, in the range of 0.5 to 20 nanometers, or in the range of 0.5 to 10 nanometers.

In some embodiments, the composite particle is free of covalent bonds or ionic bonds between an outer surface of the semiconductor particle and the cored dendrimer. That is, the cored dendrimer does not have groups along the length of the molecular chains of the dendrons or at the outer periphery of the molecular chains of the dendrons that can form a coordinative bond or an ionic bond with a metal-containing precursor or semiconductor particle. The only groups capable of forming such a bond with a metal-containing precursor, semiconductor particle, or both are the interior end groups.

The lack of additional groups capable of bonding with a metal-containing precursor, semiconductor particle, or a combination thereof results in the formation of semiconductor particles that have an outer surface that is non-passivated and that is not bonded to the core dendrimer. This can be advantageous for applications where coordinated semiconductor surfaces tend to be less reactive than semiconductor surfaces that are not coordinated.

In a third aspect, a composition is provided that include an organic matrix and a composite particle in the organic matrix. The composite particle includes a semiconductor particle within a central interior region of a cored dendrimer. The cored dendrimer has crosslinked dendrons surrounding the central interior region and the central interior region is free of organic material. The semiconductor particle has a size that is greater than the central interior region of the cored dendrimer and that is no greater than an outer dimension of the cored dendrimer.

The organic matrix usually contains polymerizable monomers, polymeric material, or a combination thereof. The composite particles can be mixed with previously formed polymeric material such as polyolefins, polyesters, polyurethanes, poly(meth)acrylates, polystyrenes, polycarbonates, polyimides, and the like. Alternatively, a polymeric material can be formed in the presence of the composite particles from polymerizable monomers.

Representative examples of polymerizable monomers that can be used to form the organic matrix of the composite material include (meth)acrylates, (meth)acrylamides, olefins, styrenes, epoxides and the like. Also, reactive oligomers such as acrylated or methacrylated polyesters, polyurethanes, or acrylics may also be used. The resulting composite material may be shaped or coated and then polymerized, for example, via a free-radical mechanism. Photopolymerization may be initiated by the use of a photoinitiator such as that commercially available from Ciba Specialty Chemicals, Tarrytown, N.Y. under the trade designation "IRGACURE" and "DAROCUR" or from BASF, Mt. Olive, N.Y. under the trade designation "LUCERIN". Other suitable polymerization initiators include, for example, organic peroxides, azo compounds, and the like.

The crosslinked polymeric shell of the composite particle can function to protect the particles from agglomeration when placed in an organic matrix. Further, the crosslinked polymeric shell tends to dictate the solubility properties of the composite particles as well as the compatibility with various binder systems and solvents. For example, polymeric crosslinked shells that are non-polar, such as those formed by crosslinking a poly(benzyl ether), tend to be compatible with organic matrixes such as, for example, polystyrene or poly (methylmethacrylate). In another example, polymeric crosslinked shells that are aliphatic, such as those formed by crosslinking poly(amidoamines), tend to be compatible with more polar organic matrixes such as polymethacrylic acid, polyacrylic acid, polyacrylamide, polymethacrylamide, and the like.

The composite particles or compositions that include the composite particles can be used for a variety of applications. For example, the composite particles can be added to an organic matrix to alter the refractive index of the organic matrix, increase the x-ray opacity of the organic matrix, or both. In some examples, the organic matrix can remain optically transparent even though the refractive index or x-ray opacity has been increased.

EXAMPLES

These examples are for illustrative purposes only and are not meant to be limiting on the scope of the appended claims. All parts, percentages, ratios, etc. in the examples and the rest of the specification are by weight, unless noted otherwise. Solvents and other reagents used were obtained from Sigma-Aldrich Chemical Company; Milwaukee, Wis. unless otherwise noted.

TEM Analysis

An assessment of the particles sizes (and size distribution) for each type of material was performed using transmission electron microscopy (TEM). Once the initial survey images were obtained for each sample type, more detailed images were prepared for particle counting and sizing.

The samples that were analyzed using TEM were typically dispersed in a liquid. To perform the TEM analysis, the samples were shaken well and 2 microliters of the dispersion was placed onto a TEM grid using a micropipette. The TEM grids were ultrathin carbon/formvar microscopy grids that were obtained from Ted Pella, Inc., Redding, Calif. The ultrathin carbon/formvar grids were pre-treated by dipping the grids consecutively into acetone (5 seconds), chloroform (20 seconds), and acetone (5 seconds) to dissolve away the formvar region of the support film.

The electron micrographs were obtained using either a Model H9000 transmission electron microscope, operating at 300 kV, from Hitachi High Technologies America, Inc., Pleasanton, Calif., or a Model 200CX transmission electron microscope, operating at 200 kV, from JEOL-USA, Inc., Peabody, Mass. Digital images were recorded using a GATAN model 794 CCD camera. Bright field/dark field images were recorded for particle sizing and high resolution electron microscopy images (HREM) were used for verification of particle crystallinity and particle shape. The HREM imaging mode allowed for atomic resolution of the lattice spacing in the particles.

TEM bright field images were obtained from the transmitted beam when some or all of the scattered (diffracted) electron beam was blanked off with an objective aperture. Any features that caused the electron beam to scatter (such as a small particle, grain boundary or dislocation) or diffract (grain oriented in a diffracting condition) generally appeared dark in a TEM bright field image.

TEM dark field images were formed from a specific diffracted beam from the diffraction pattern of the particles being viewed. Using this technique, only information from a specific diffraction condition (e.g. from a particular particle oriented for strong diffraction) appeared bright. Additionally, any features that were scattering into the specific diffraction spot appeared bright (e.g. defects, grain boundaries, dislocations, stacking faults, or twins).

Preparative Example 1

A cored dendrimer containing eight interior carboxylic acid functional groups was prepared and characterized as detailed by S. C. Zimmerman et al., *Nature*, vol. 418, 399-403 (2002) and Wendland et al., *J. Am. Chem. Soc.*, 121, 1389-1390 (1999). The core organic material was 5,10,15,20-tetrakis(3,5-dihydroxylphenyl)-21H,23H-porphine. The dendrons attached to the core organic material had the following structure.

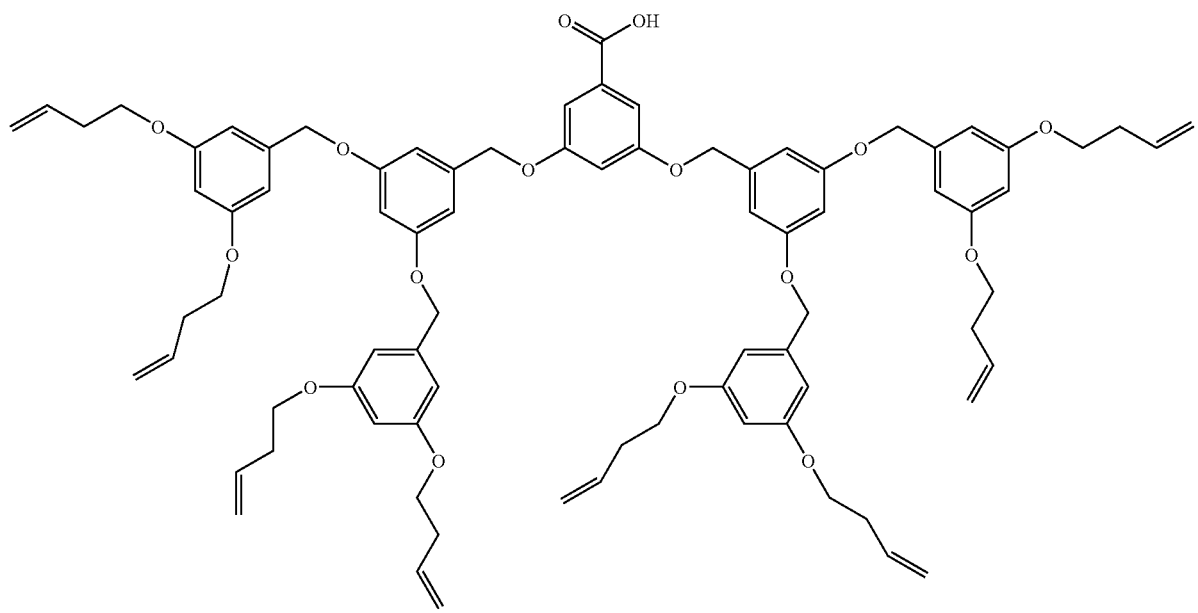

The attachment group was a carboxylate ester. The alkenyl crosslinkable groups on the dendrons were crosslinked using a Grubbs' ruthenium alkylidene catalyst. The attachment group was cleaved using potassium hydroxide in a tetrahydrofuran-ethanol-water mixture.

Example 1A-1C and Comparative Example 1

A series of Examples (1A-1C) and Comparative Example (C1) were prepared as summarized in Table 1. Comparative Example C1 contained no cored dendrimers. For each sample, the cadmium ion solution ($Cd(NO_3)_2 \cdot 4H_2O$ dissolved in methanol at a concentration of 0.27 moles/liter), cored dendrimer from Preparative Example 1, and PMP (1,2,2,6,6-pentamethylpiperidine) were added to 2 mL glass vials and magnetically stirred for 1 hour. The sulfide ion solution ($Na_2S \cdot 9H_2O$ dissolved in water at a concentration of 0.46 moles/liter) was added and the resulting mixture was stirred (5 minutes) causing the formation of a yellow precipitate (CdS) within a few seconds. Chloroform (1.5 mL) was then added to each sample and the liquid was transferred to tubes for centrifugation (1 minute at about 1500 rpm). The supernatant was collected and any residual precipitate that coated the tubes and did not dissolve in chloroform was discarded. That is, the cored dendrimers filled with semiconductor particles were separated from any residue precipitate by extracting the composite particles into chloroform.

The resulting solutions were tested for the presence of semiconductor particles. The supernatant was irradiated (365 nm) using a hand-held UV lamp (UVP, Upland, Calif.). A faint blue/green fluorescence indicated that semiconductor nanoparticles were present in the supernatant. Example 1C exhibited a yellow-orange fluorescence when irradiated, while Examples 1A and 1B had very faint orange and yellow fluorescence.

TEM analysis was conducted to assess the particles produced via this synthesis. Example IC exhibited particles on the order of 3-4 nanometers. Example 1A also exhibited a small number of particles by TEM Analysis.

TABLE 1

| Sample | Cadmium Ion Solution (microliters) | Sulfide Ion Solution (microliter) | PMP (microliter) | Cored Dendrimer 0.002 moles/liter in chloroform (microliter) |
|---|---|---|---|---|
| Ex. 1A | 6 | 9 | None | 100 |
| Ex. 1B | 6 | 9 | 10 | 100 |
| Ex. 1C | 20 | 30 | 10 | 100 |
| Comp. Ex. C1 | 20 | 30 | 10 | None |

Example 2

A reaction mixture similar to Example 1C was prepared with 20 microliters of zinc ion solution (($Zn(NO_3)_2 \cdot 6H_2O$ dissolved in methanol at a concentration of 0.27 moles/liter) used in place of cadmium ion solution. After the same workup described for Example 1, a chloroform solution of the composite particles was subjected to a qualitative, initial check for the presence of semiconductor particles. The supernatant was irradiated (365 nm) using a hand-held UV lamp (UVP, Upland, Calif.). A faint blue/green fluorescence indicated that semiconductor nanoparticles were present in the supernatant. TEM analysis demonstrated that the particles had a size of about 5 nanometers. The TEM is shown in FIG. 1.

Example 3

A solution was prepared that contained 0.31 weight percent of the cadmium sulfide particles of Example 1C and 0.69 weight percent polystyrene in chloroform. The polystyrene had a weight average molecular weight ($M_w$) of 280,000 g/mole. A 100 microliter sample of this solution was applied to a piece of release liner and the film was allowed to air dry. The solid, somewhat brittle film was then submitted for TEM analysis. TEM analysis revealed a combination of darkened domains with sizes on the order of 100 nanometers or less amidst a continuous matrix. Higher magnification revealed a cluster of nanoparticles within the discontinuous phase with the particles remaining discrete and of the same size as in a solution sample. The TEM is shown in FIG. 2.

We claim:

1. A method of making semiconductor particles, the method comprising:
   a) providing a dendrimer comprising
      a core organic material;
      a first dendron bonded to the core organic material through a first attachment group, the first dendron having at least two first crosslinkable groups; and
      a second dendron bonded to the core organic material through a second attachment group, the second dendron having at least two second crosslinkable groups;
   b) forming a crosslinked dendrimer by reacting the first crosslinkable groups and the second crosslinkable groups;
   c) cleaving by a chemical reaction both the first attachment group and the second attachment group;
   d) removing the core organic material or a derivative thereof from the crosslinked dendrimer to form a cored dendrimer having interior end groups;
   e) forming a coordinative bond or an ionic bond between a metal-containing precursor and the interior end groups within a central region of the cored dendrimer; and
   f) precipitating the metal-containing precursor to form a composite particle comprising a semiconductor particle within the central region of the cored dendrimer.

2. The method of claim 1, wherein forming the crosslinked dendrimer comprises reacting at least one of the first crosslinkable groups of the first dendron with at least one of the second crosslinkable groups of the second dendron.

3. The method of claim 1, wherein forming the crosslinked dendrimer comprises reacting at least one of the first crosslinkable groups of the first dendron and at least one of the second crosslinkable groups of the second dendron with a difunctional crosslinking agent.

4. The method of claim 1, wherein the end groups within the interior of the cored dendrimer comprise, a carboxy, hydroxy, amino, mercapto, sulfono, sulfamino, phosphono, phosphonamino, phosphate, borono, silanol, formyl, or acyl group.

5. The method of claim 1, wherein the first dendron and the second dendron comprise a poly(benzyl ether).

6. The method of claim 1, wherein each dendron has a crosslinkable group at the outer periphery of each molecular chain.

7. The method of claim 1, wherein the semiconductor particle comprises a metal chalcogenide.

8. The, method of claim 1, wherein precipitating the metal-containing precursor comprises adding a chalcogenide source.

9. The method of claim 1, wherein the semiconductor particle has a size that is no greater than an outer dimension of the cored dendrimer.

10. The method of claim 1, wherein the metal-containing precursor comprises a salt of a metal-containing species selected from cadmium, lead, zinc, or a combination thereof and precipitating the metal-containing precursor comprises adding a chalcogenide source.

11. The method of claim 1, wherein the interior end groups are the only groups of the cored dendrimer that can form coordinative or ionic bonds with the metal-containing precursor.

12. The method of claim 1, wherein the semiconductor particle has an outer surface that is not bonded to the cored dendrimer.

* * * * *

UNITED STATES PATENT AND TRADEMARK OFFICE
CERTIFICATE OF CORRECTION

PATENT NO.      : 7,413,607 B2
APPLICATION NO. : 11/095142
DATED           : August 19, 2008
INVENTOR(S)     : Neal A. Rakow It is certified that error appears in the above-identified patent and that said Letters Patent is hereby corrected as shown below:

Column 1, Line 1 – Delete "7/1998" and insert -- 6/1998 --, therefor.

Column 3, Line 61 – Delete "heterocylic." and insert -- heterocyclic. --, therefor.

Column 5-6, Line 2 – In the first structure in the Reaction Scheme A,

Delete " 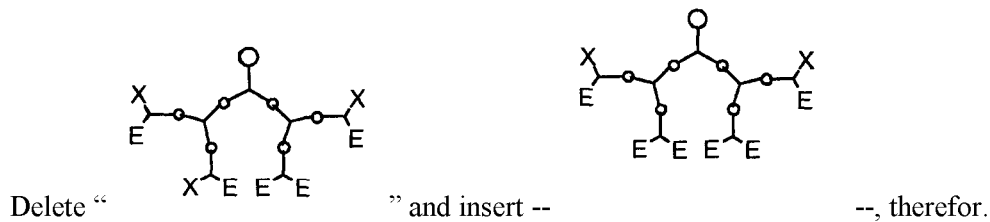 " and insert --                                 --, therefor.

Column 7-8, Line 1 (Structure IV) –

Delete " 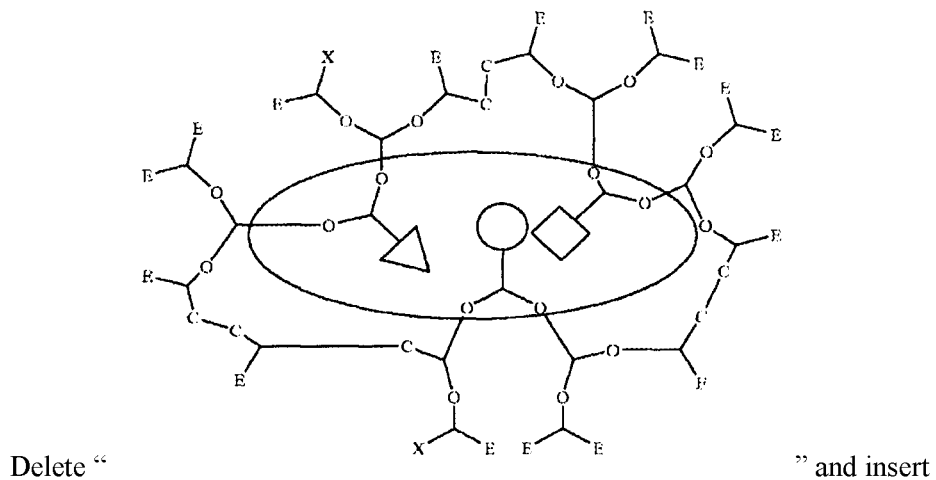                                 " and insert

Signed and Sealed this

Tenth Day of August, 2010

David J. Kappos
*Director of the United States Patent and Trademark Office*

CERTIFICATE OF CORRECTION (continued)
U.S. Pat. No. 7,413,607 B2

-- 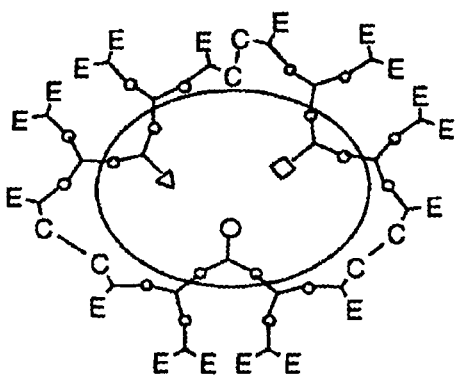      --, therefor.

Column 7, Line 63 – Delete "as5," and insert -- as 5, --, therefor.

Column 8, Line 62 – After "Synthesis" insert -- , --.

Column 8, Line 63 – Delete "Wiley- V C H," and insert -- Wiley- VCH, --, therefor.

Column 11 (Structure (2), Line 45 (Approx.) –

Delete "  " and insert -- 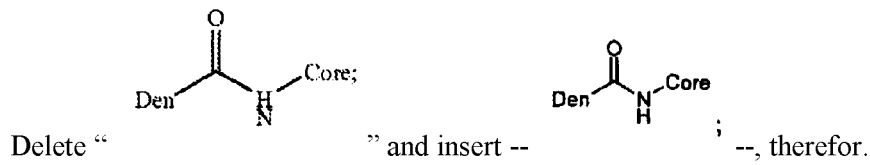 --, therefor.

Column 20, Line 14 – Delete "trifluormethylsulfonate" and insert -- trifluoromethylsulfonate --, therefor.

Column 34, Line 35 – Delete "phosphormidites" and insert -- phosphoramidites --, therefor.

Column 41, Line 7 (Approx.) – Before "1A-1C" delete "Example" and insert -- Examples --, therefor.

Column 41, Line 12 – Delete "(Cd(NO$_3$)$_2$.4H$_2$O" and insert -- (Cd(NO$_3$)$_2$•4H$_2$O --, therefor.

Column 41, Line 17 – Delete "(Na$_2$S.9H$_2$O" and insert -- (Na$_2$S•9H$_2$O --, therefor.

Column 41, Line 57 – Delete "((Zn(NO$_3$).6H$_2$O" and insert -- ((Zn(NO$_3$)•6H$_2$O --, therefor.

Column 42, Line 51 – In Claim 4, delete "comprise," and insert -- comprise --, therefor.

Column 42, Line 62 – In Claim 8, delete "The," and insert -- The --, therefor.